US 7,676,734 B2

(12) United States Patent
Yamagishi

(10) Patent No.: US 7,676,734 B2
(45) Date of Patent: Mar. 9, 2010

(54) DECODING APPARATUS AND METHOD AND INFORMATION PROCESSING APPARATUS AND METHOD

(75) Inventor: Hiroyuki Yamagishi, Tokyo (JP)

(73) Assignee: Sony Corporation, Tokyo (JP)

( * ) Notice: Subject to any disclaimer, the term of this patent is extended or adjusted under 35 U.S.C. 154(b) by 421 days.

(21) Appl. No.: 11/048,594

(22) Filed: Jan. 31, 2005

(65) Prior Publication Data
US 2005/0204272 A1 Sep. 15, 2005

(30) Foreign Application Priority Data
Feb. 3, 2004 (JP) ............................ P2004-027075

(51) Int. Cl.
*H03M 13/00* (2006.01)
*H03M 13/03* (2006.01)

(52) U.S. Cl. ....................... 714/780; 714/758; 714/794; 714/795

(58) Field of Classification Search ................. 714/758, 714/794, 795, 780
See application file for complete search history.

(56) References Cited

U.S. PATENT DOCUMENTS

| | | | | |
|---|---|---|---|---|
| 6,633,856 B2 * | 10/2003 | Richardson et al. | ............ | 706/15 |
| 6,751,770 B2 * | 6/2004 | Morelos-Zaragoza | ....... | 714/781 |
| 6,757,122 B1 * | 6/2004 | Kuznetsov et al. | ............ | 360/53 |
| 6,857,097 B2 * | 2/2005 | Yedidia et al. | ............... | 714/752 |
| 6,938,196 B2 * | 8/2005 | Richardson et al. | ......... | 714/752 |
| 7,133,853 B2 * | 11/2006 | Richardson et al. | ........... | 706/15 |
| 7,137,060 B2 * | 11/2006 | Yu et al. | ...................... | 714/794 |
| 7,174,495 B2 * | 2/2007 | Boutillon et al. | ............ | 714/752 |
| 7,222,284 B2 * | 5/2007 | Stolpman | .................... | 714/774 |
| 2004/0258177 A1 * | 12/2004 | Shen et al. | ................... | 375/308 |

FOREIGN PATENT DOCUMENTS

JP 2002118474 4/2002

OTHER PUBLICATIONS

Zhang et al., "A 54 MBPS (3,6)-Regular FPGA LDPC Decoder," IEEE Workshop on Signal Processing Systems', 2002, 127-132.

* cited by examiner

*Primary Examiner*—Joseph D Torres
(74) *Attorney, Agent, or Firm*—K&L Gates LLP

(57) ABSTRACT

A decoding apparatus, decoding the LDPC code using a message passing algorithm, sets a message as a log likelihood ratio having, as a base, a real number "a" which is a power of 2, and includes a check node processing calculating unit for receiving a message from a bit node to calculate a message from a check node. The check node processing calculating unit includes a converter for converting an absolute value x of the message to output f (x) and a converting unit supplied as an input y with a sum of the absolute values x of the message from the totality of the bit nodes less one, converted by the converter, subdividing the input y in preset domains and for converting the number in the domain into g (y), and expresses the boundary values of the domains of the input y and f (x) by a power of 2.

14 Claims, 27 Drawing Sheets

$$\begin{bmatrix}
0 & 1 & 0 & 1 & 0 & 0 & 0 \\
0 & 0 & 1 & 0 & 0 & 0 & 1 \\
0 & 0 & 0 & 0 & 0 & 1 & 1 \\
1 & 0 & 1 & 0 & 0 & 0 & 0 \\
0 & 1 & 0 & 0 & 0 & 1 & 0 \\
0 & 0 & 0 & 0 & 1 & 1 & 0 \\
0 & 1 & 0 & 0 & 0 & 0 & 1 \\
1 & 0 & 0 & 0 & 1 & 0 & 0 \\
0 & 0 & 0 & 1 & 1 & 0 & 0 \\
1 & 0 & 0 & 0 & 0 & 1 & 0 \\
0 & 0 & 0 & 1 & 0 & 0 & 1 \\
0 & 0 & 1 & 1 & 0 & 0 & 0 \\
0 & 0 & 0 & 0 & 1 & 0 & 1 \\
0 & 0 & 1 & 0 & 0 & 1 & 0 \\
0 & 1 & 1 & 0 & 0 & 0 & 0 \\
0 & 0 & 0 & 1 & 0 & 1 & 0 \\
0 & 1 & 0 & 0 & 1 & 0 & 0 \\
1 & 1 & 0 & 0 & 0 & 0 & 0 \\
0 & 0 & 1 & 0 & 1 & 0 & 0 \\
1 & 0 & 0 & 1 & 0 & 0 & 0 \\
1 & 0 & 0 & 0 & 0 & 0 & 1
\end{bmatrix}$$

FIG. 1

DECODING APPARATUS AND METHOD AND INFORMATION PROCESSING APPARATUS AND METHOD

BACKGROUND OF THE INVENTION

The present invention relates to a decoding apparatus and a decoding method for soft decision decoding of a low density parity check code (LDPC), and to an information processing method and an information processing apparatus employing the decoding apparatus.

The low density parity code, referred to below as LDPC code, is a sort of a linear code, publicized in 1962 by Robert G. Gallager, and is featured by the fact that the number of non-zero elements of the parity check matrix is small as compared to the total number of the elements, that is that the non-zero elements of the parity check matrix is low in density (see the Non-Patent Publication 1, indicated below).

It is also known that, since no short cycles are contained in a bipartite graph of the parity check matrix, the LDPC code exhibits satisfactory bit error characteristics.

In a communication channel suffering from noise or erasure, it is customary to use error correction codes in which an information word may be estimated correctly on the receiving side. FIG. 23 shows an example of a communication system employing the LDPC code. Referring to FIG. 23, a communication apparatus 200 includes an LDPC encoding unit 201 for generating an LDPC code from an information word (message), a communication channel 202 for transmitting the codeword, and an LDPC decoding unit 203 for receiving a word from the communication channel 202 to decode the code.

The transmitting side LDPC codes the information word to send the resulting codes to the communication channel 201. The receiving side receives a signal, including the noise added on the communication channel 201, and decodes the received signal by an encoding rule used on the transmitting side to estimate the information word. In case the LDPC code is used, iterative decoding employing the soft decision information is usually carried out. The iterative decoding, employing the soft decision information, is carried out, for example, in the turbo code having properties similar to those of the LDPC code.

The LDPC code may be applied not only to the above communication system but also to a recording and/or reproducing channel. FIG. 24 depicts a block diagram showing a recording and/or reproducing system 210 employing the LDPC code. Referring to FIG. 24, the recording and/or reproducing system 210 includes an LDPC encoding unit 211 for generating an LDPC code from a message, such as music or pictures, a recording and/or reproducing system unit 212 for channel-encoding and recording the LDPC codes generated and reading out and channel-decoding the signals recorded, and an LDPC decoding unit 213 for detecting codes from the channel-decoded data. The data, having the codes detected by the LDPC decoding unit 213, are decoded into messages.

That is, the information words are LDPC encoded, during the recording, and recorded on a recording medium. During the reproduction, the signals, corrupted with the noise, are read out from the recording medium and channel detection responsive to inter-symbol interference of the channels and channel decoding are carried out as necessary, followed by decoding, based on the LDPC encoding rule used during the recording, to estimate the information word.

The LDPC code, used in, for example, the communication system or the recording and/or reproducing system, is now explained in detail. With a parity check matrix H of a parity check matrix, having M rows and N columns, an optional codeword vector c of an LDPC code, with a code length N, satisfies the following equation (1):

$$Hc = 0 \quad (1)$$

where H is an M-row N-column parity check matrix.

This equation (1) represents M parity check equations. If the rank of H is given by (N−K), where K is a dimension, the code rate of the LDPC codes is given by K/N. In case M>N−K, it indicates that there is a redundant parity check equation.

FIG. 1 shows an example of a parity check matrix of the binary LDPC code. This 7-row 21-column matrix has a rank equal to 6, and the code thereby determined is a linear code with a code length N=21 and with a dimension K=15. In this matrix, the number of non-zero elements in each row (number of "1"s) (Hamming weight) Wc is unexceptionally 6, while the number of non-zero elements in each column (number of "1"s) (Hamming weight) Wc is unexceptionally 2. The LDPC code having a parity check matrix with uniform Wc is called a regular LDPC code.

The LDPC code is a linear code and is not limited to binary codes. That is, the same discussions may be made for cases other than the binary code. However, in the following explanation, the case of a binary code is unexceptionally taken as an example.

In the above-described communication system or recording and/or reproducing system, the information word (message) is LDPC-coded for detecting the codes by the parity check matrix in the LDPC decoding unit 203 or in the LDPC decoding unit 213 in the LDPC encoding unit 201 or in the LDPC encoding unit 211. For obtaining the LDPC code, a K-row N-column generator matrix G (satisfying $GH^T=0$) is first found from an M-row N-column K-dimensional parity check matrix H. An N-bit codeword $((m_0 m_1 \ldots m_{k-1})G = (c_0 c_1 \ldots c_{N-1})$ may be obtained by multiplying a K-bit binary message $(m_0 m_1 \ldots m_{k-1})$ with the generator matrix G. The codeword, thus obtained, is transmitted via a modulator to a communication channel and received as a received signal by the receiving side. This received signal is demodulated and then decoded by the parity check matrix so as to be output as an estimated value of the transmitted message K bits $(m_0\hat{}\, m_1\hat{} \ldots m_{k-1}\hat{})$ where $\hat{}$ indicates a hat, hereinafter the same.

The code detecting method for detecting the code from the received signal is now explained. It is known that the LDPC codes may be code-detected by a message passing algorithm, based on a parity check matrix or on a bipartite graph. The bipartite graph, representing the M-row N-column parity check matrix, is made up by M nodes, associated with the check, N nodes (variable nodes) associated with variables, and edges interconnecting the nodes. The edges are associated with the sites of non-zero elements of the parity check matrix, such that the n'th check nodes and the n'th variable nodes are interconnected at the edges only when the element of the n'th row and the n'th column is not zero. Since the case of the binary code is here explained, the variable node is expressed hereinbelow as a bit node.

FIG. 2 shows a bipartite graph associated with the parity check matrix of FIG. 1. The graph is made up by seven check nodes $X_m$ ($X_0$ to $X_6$), represented by circles (○), and by 21 bit nodes $Y_n$ ($Y_0$ to $Y_{20}$), represented by squares (□). To each check node $X_m$, there are connected six edges, whereas to each bit node $Y_n$, there are connected two edges.

The LDPC codes may be decoded by an SISO (Soft-In Soft-Out) decoding method by the message passing algorithm or the sum-product algorithm, in which a message is propagated between the check node $X_m$ and the bit node $Y_n$, interconnected by an edge, and iterating message exchanges from the bit node $X_m$ to the check node $Y_n$ and from the check node $Y_n$ to the bit node $X_m$. This message passing algorithm may be carried out by iterating the following sequential operations:

[1] Operation 0—Initializing

For all edges, emanating from the respective bit nodes $Y_n$, the messages $q^0_{m,n}$ and $q^1_{m,n}$, propagated from the bit node $Y_n$ to the check node $X_m$, are initialized with the priori probability $p^0_n$, $p^1_n$. It is noted that $p^x n$ denotes the priori probability for the bit n being "x".

[2] Operation 1—Processing at the Check Modes

For the totality of the edges, emanating from the check nodes $X_m$, the messages $r^0_{m,n}$ and $r^1_{m,n}$, propagated from the check node $X_m$ to the bit node $Y_n$, are found in accordance with the following equations:

$$r^0_{m,n} = \frac{1 + \prod_{n' \in N(m)\backslash n}(q^0_{m,n'} - q^1_{m,n'})}{2} \quad (2\text{-}1)$$

$$r^1_{m,n} = \frac{1 - \prod_{n' \in N(m)\backslash n}(q^0_{m,n'} - q^1_{m,n'})}{2} \quad (2\text{-}2)$$

where N(m): the column numbers of non-zero elements in an n'th column of the parity check matrix X\y: set obtained on eliminating elements y from a set X.

[3] Operation 2—Processing in a Bit Node

The posteriori probability of the respective bits $q^0_n$ and $q^1_n$ of the respective bits are found as necessary from the following equation:

$$q^0_n = a_n p^0_n \prod_{m \in M(n)} r^0_{m,n} \quad (3\text{-}1)$$

$$q^1_n = a_n p^1_n \prod_{m \in M(n)} r^1_{m,n} \quad (3\text{-}2)$$

where

M(n): column numbers of non-zero elements in an n'th column of the parity check matrix $a_n$: normalizing constant for setting $q^0_n + q^1_n = 1$.

In case further iterations are needed, the messages propagated from the bit node $Y_n$ to the check node $X_m$ are calculated in accordance with the following equations:

$$q^0_{m,n} = a_{m,n} p^0_n \prod_{m' \in M(n)\backslash m} r^0_{m',n} \quad (4\text{-}1)$$

$$q^1_{m,n} = a_{m,n} p^1_n \prod_{m' \in M(n)\backslash m} r^1_{m',n} \quad (4\text{-}2)$$

where $a_{m,n}$: normalizing constant for setting $q^0_{m,n} + q^1_{m,n} = 1$.

With regard to the decoding by the message passing algorithm, the operations 1 and 2 are iterated until the conditions for termination are met and, ultimately, the information word is estimated by hard decision decoding. Customarily, the conditions for termination are:

1) that the number of times of iteration has reached the preset value; and 2) that, if the number of times of iteration has not reached the preset value, but the result of hard decision has satisfied the parity check condition. The parity check is represented by the following equation (5):

If the result of hard decision: ĉ the parity check: $H\hat{c}=0$ \quad (5)

Meanwhile, ĉ (c hat) is also described by cˆ in the following explanation.

As a calculating method, equivalent to the above algorithm, the operations of multiplication may be replaced in their entirety by the addition by conversion into calculating expressions in the log domain by employing the log likelihood ratio (LLR), thereby simplifying the processing by hardware or software. The algorithm for calculations in the log domain is as follows:

[1] Operation 0—Initializing

For the totality of the edges, emanating from the respective bit nodes $Y_n$, the messages $Q_{m,n}$ propagating the edges are initialized by the priori log likelihood $P_n$ of the respective bits. It is noted that the messages $Q_{m,n}$ propagating the edges and the priori log likelihood $P_n$ of the respective bits are defined as in the following equations (6-1) and (6-2), respectively:

$$Q_{m,n} = \ln(q^0_{m,n}/q^1_{m,n}) \quad (6\text{-}1)$$

$$P_n = \ln(p^0_n/p^1_n) \quad (6\text{-}2)$$

[2] Operation 1—Processing

For the totality of edges, emanating from the check nodes $X_m$, the messages $R_{m,n}$, propagating the edges, are calculated by the following equation (7-1), where $A_m$, $B_m$ and the message $R_{m,n}$ are defined as shown by the equations (7-2) to (7-4) and the functions f, g, $\alpha_{m,n}$ and $\beta_{m,n}$ are represented by the following equations (7-5) to (7-8):

$$R_{m,n} = \left(\prod_{n' \in N(m)\backslash n} \alpha_{m,n'}\right) g\left(\sum_{n' \in N(m)\backslash n} f(B_{m,n'})\right)$$

$$= (A_m/\alpha_{m,n}) g(B_m - f(\beta_{m,n}))$$

$$A_m \equiv \prod_{n' \in N(m)} \alpha_{m,n'} \quad (7\text{-}2)$$

$$B_m \equiv \sum_{n' \in N(m)} f(\beta_{m,n'}) \quad (7\text{-}3)$$

messages $R_{m,n} = \ln(r^0_{m,n}/r^1_{m,n})$ \quad (7-4)

$$f(x) = \ln\frac{e^x + 1}{e^x - 1} = -\ln\tanh(x/2) \quad (7\text{-}5)$$

$g(x) = -\ln\tan h(x/2)$: inverse function of function $f$ \quad (7-6)

$\alpha_{m,n}$: code part of $Q_{m,n}$ \quad (7-7)

$\beta_{m,n}$: absolute value of $Q_{m,n}$ \quad (7-8)

[3] Operation 2—Processing in the Bit Node

The posterior log likelihood Qn of each bit, defined by the following equation (8):

$$Q_n = \ln(q^0_n/q^1_n) \quad (8)$$

is found from the following equation (9):
posteriori value:

$$Q_n = P_n + \sum_{m \in M(n)} R_{m,n} \quad (9)$$

In case further iterations are necessary, the messages $Q_{m,n}$, propagated from the bit node $Y_n$ to the check node $X_m$ are calculated in accordance with the following equation (10):

$$Q_{m,n} = P_n + \sum_{m' \in M(n) \backslash m} R_{m',n} = Q_n - R_{m,n} \quad (10)$$

A specified example of a decoding device, configured for decoding the LDCP codes by iterating the calculations of the above operations 1 and 2, is now explained. FIG. 25 depicts a block diagram showing a decoding device described in the Non-Patent Publication 2 by T. Zhang et al.

Referring to FIG. 25, the decoding device 300 is made up by a memory 301, in which to store the priori values, a bit node processing calculating unit 302 for carrying out calculations in the bit node $Y_n$, a check node processing calculating unit 303 for carrying out calculations in the check node $X_m$, a memory 304 in which to store messages $R_{m,n}$ from the bit node $Y_n$ to the check node $X_m$ and from the check node $X_m$ to the bit node $Y_n$, and a hard decision decoder 305 for carrying out hard decision decoding responsive to the result of the bit node processing calculating unit 302 to output an estimated information word. This decoding device 300 uses the same calculating unit for each iteration and each calculating unit performs processing of multiple nodes time-divisionally.

The decoding device 300 is supplied with replay signals or received signals, corrupted with noise, which are saved in the memory 301 adapted to store priori values. The messages are iteratively propagated, via memory 304 for message storage, between the bit node processing calculating unit 302 for carrying out the processing of the above operation 2, and the check node processing calculating unit 303 for carrying out the processing of the above operation 1. Ultimately, the hard decision decoder 305 performs hard decision decoding to estimate the information word. It is noted that the initializing operations and the decision unit for deciding on the condition for terminating the repetitions are omitted for simplicity.

The configuration of a check node processing calculating unit 303 for reading out the message $Q_{m,n}$ from the bit node $Y_n$ to the check node $X_m$, from the memory 304, and for calculating the message $R_{m,n}$ to be transferred from the check node $X_m$ to the bit node $Y_n$, is specifically explained.

FIG. 26 depicts a circuit diagram showing an example of major parts of a check node processing calculating unit. Here, an example of a calculating unit corresponding to the check of the first row of the parity check matrix shown in FIG. 1, is specifically shown.

In FIG. 26, a check node processing calculating unit 400 includes a converter 401$_t$ (401$_0$ to 401$_5$ in FIG. 26) for transforming absolute values $\beta_{m,n}$ of the message $Q_{m,n}$ at a corresponding location to a function f, an adder 402 for finding $B_m$, representing the sum thereof, shown in the equation (7-3), an adder 403$_t$ for finding the difference from the function f obtained from the messages $Q_{m,n}$, corresponding to $B_m$, a converter 404$_t$ for transforming an output of the adder 403$_t$ into a function g, a multiplier 407 for multiplying the totality of codes $\alpha_{m,n}$ of the message $Q_{m,n}$ to find $A_m$ shown in the above equation (7-2), a multiplier 406$_t$ for multiplying an output ($A_m$) of the multiplier 407 with the code $\alpha_{m,n}$ of the corresponding message $Q_{m,n}$, and a multiplier 405$_t$ for multiplying the outputs of the converters 404$_t$ and 406$_t$ to output the message $R_{m,n}$.

It is noted that the function f, used in finding the message $R_{m,n}$ from the check node $X_m$ to the bit node $Y_n$, is a function for converting a log likelihood ratio $|\ln(q^0_{m,n}/q^1_{m,n})|$ into $-\ln|q^0_{m,n} - q^1_{m,n}|$. The function g is an inverse transform of the function f and is a function of converting $-\ln|r^0_{m,n} - r^1_{m,n}|$ into a log likelihood ratio $|\ln(r^0_{m,n}/r^1_{m,n})|$. The functions f and g are of complex form inclusive of a hyperbolic function or a log function and, thus are implemented in many cases by approximate values. In case the LDPC codes are decoded on a circuit or by software, it is customary to limit the values that can be assumed by a message to a finite number of discrete values.

In the Patent Publication 1, for example, recited below, $f_Q(x)$, in which as-converted values are represented by a finite number of discrete values, is defined, as an approximation of the function f(x), as shown by the following equation (11):

$$f_Q(x) = \begin{cases} 5.00, & 0 \le x \le 0.10 \\ 2.25, & 0.10 \le x \le 0.35 \\ 1.50, & 0.35 \le x \le 0.60 \\ 1.00, & 0.60 \le x \le 0.90 \\ 0.75, & 0.90 \le x \le 1.20 \\ 0.50, & 1.20 \le x \le 1.60 \\ 0.30, & 1.60 \le x \le 2.30 \\ 0.10, & 2.30 \le x \end{cases} \quad (11)$$

As a method for implementing $f_Q(x)$, indicated by this equation (11), it may be considered to formulate a table for $f_Q(x)$, with all values that may be assumed by x as indices, in the above converter 401$_t$, and to output $f_Q(x)$, corresponding to x, obtained on having reference to this table (=absolute value $\beta_{m,n}$ of the message $Q_{m,n}$). It also may be considered to find which domain x belongs to and to output a corresponding value, as now explained.

FIG. 27 depicts a circuit diagram showing an example of a converter outputting $f_Q(x)$ from an input x. A converter 410 includes comparators 411$_0$ to 411$_6$ for determining whether the value of x given is not larger than 0.1, 0.35, 0.60, 0.90, 1.2, 1.6 or 2.3, respectively, AND gates 412$_1$ to 412$_6$ for outputting an AND of the decision value of the comparator 411 and inverted values of decision values of the preceding stages, a NOT gate 415 for inverting a decision value of a comparator 411$_6$ of the last stage, and a selection circuit 416, supplied with outputs of the comparator 411$_0$ of the foremost stage, AND gates 412$_1$ to 412$_6$ and the NOT gate 415 to select $f_Q(x)$ depending on these outputs. Thus, it is first determined to which of the eight ranges of the equation (11) belongs x, and the selection circuit 416 then selects the value of $f_Q(x)$ based on the results to output the value indicating the so selected value.

[Non-Patent Publication 1] R. C. Gallager, 'LDCP codes (Low Density parity Check Codes)', MIT Press, 1963,

[Non-Patent Publication 2] T. Zhang and K. K. Parhi, 'A 54 MBP (3,6)—REGULAR FPGA LDPC DECODER', IEEE Workshop on Signal Processing Systems', 2002, pp 127 to 132.

[Patent Publication] Japanese Laid-Open Patent publication 2002-118474

However, the method for transforming a function f and for inverse transform g in a check node processing calculating unit, consisting in formulating $f_Q(x)$ in a table, with all values that can be assumed by x, as indices, and in storing the table in a ROM or in an array for reading out later, suffers a problem that, since the table becomes longer as the unit of quantization for x becomes smaller, the ROM or the array as needed becomes larger. If, on the other hand, it is determined which is the range of x by the circuit shown in FIG. 27, the number of the comparators $411_i$ is increased with the number of the domains of x (eight in the case of $f_Q(x)$ shown in the above equation (11)), while the configuration of the selection circuit 416, selecting an output value, becomes complex. The function g, given by the same function as the function f, suffers from a similar problem

SUMMARY OF THE INVENTION

In view of the above depicted status of the art, the present invention seeks to provide a decoding method and apparatus, and an information processing method and apparatus, according to which, in implementing the calculations in the log domain of the message passing algorithm, the results of calculations of the message passing algorithm can be found out readily by a circuit or by a computer.

In one embodiment, the present invention provides a decoding apparatus for decoding the low density parity check code using a message passing algorithm configured for propagating messages between a number of check nodes and a number of variable nodes, the check and variable nodes corresponding to the low density parity check code. The message is set as a log likelihood ratio having, as a base, a real number a which is a power of 2. The decoding apparatus includes a check node processing calculating unit for receiving a first message delivered from a variable node to a check node to calculate a second message delivered from the check node to the variable node, and a variable node processing calculating unit for receiving the second message calculated by the check node processing calculating unit to calculate the first message. The check node processing calculating unit includes a first converting circuit for converting an absolute value x of the first message into a value of the power of 2 to output the value.

According to the present invention, in which the value transformed by the first converting circuit is output as a value of the power of 2 to provide an output value suitable for binary representation, it is possible to simplify the calculations in the first converting circuit or the circuit.

The first converting circuit converts an absolute value of the first message by a function $F(x)=2Ca^{-x}$, where C is an optional constant. By suitably selecting the constant C, the converted value by the function F(x) of the absolute value x of the first message may be the power of 2.

The check node processing calculating unit may include a second converting circuit for subdividing an input y into a number of domains having boundary values prescribed with powers of 2. The input value y is a sum of values converted by the first converting circuit from absolute values x of the first message from the totality of the variable nodes less one variable node. The second converting circuit converts the numbers in the domain into integers. This second converting circuit subdivides the input y into a number of domains and transforms the numbers of the respective domains into integer values as representative values. Since the boundary values of the domains are expressed by powers of 2, as numbers suited for binary representation, it readily may be determined to which domain belongs the input y, thus simplifying the calculations in the second converting circuit or the circuit configuration.

The check node processing calculating unit may include a second converting circuit which is supplied with, and subdivides, an input y into a number of domains having boundary values prescribed with powers of 2. The input value y is a sum of values converted by the first converting circuit from absolute values x of the first messages from the totality of the variable nodes less one variable node. The second converting circuit converts the numbers in the domain into integers by an inverse function G(y) of the function F(x). The boundary values of the domains subdividing the input y may be a power of 2 by suitably selecting the constant C.

The absolute value x of the first message may be one of values offset by ½ from discrete values including zero and spaced apart from one another by a constant interval. In case the absolute value x of the message is a discrete value offset by 0.5 from an integer value, the functions F(x), G(y) may be implemented readily, while an error of approximation in case of using the function F(x) may be reduced, by suitably selecting the constant C, insofar as the base a in the log likelihood ratio representation of the message is a power of 2.

In case the first converting circuit includes an outputting unit for outputting a value equal to a power of 2, based on the absolute value x of the first message, the output may be expressed by a fixed binary point number. If the first converting circuit includes a mantissa part of the value of the power of 2 as 1 and for outputting an exponential part of the value of the power of 2 as an integer part of the absolute value x of the first message ×N×(−1), with a real number $a=2^N$, N being a positive integer, the output may be expressed by a floating binary point number.

The second converting circuit may include a decision unit for determining the domain to which belongs the input y and an output unit for outputting an integer based on the result of decision. In case the input y is expressed by the fixed binary point number, it is only sufficient for the decision unit to decide on the domain to which belongs y, based on the bit pattern of the input y, because the input y is subdivided into domains the boundary values of which are prescribed by the powers of 2. The domains of the input y readily may be determined by counting the number of contiguous 0's from the MSB of the bit pattern to output a representative integer value.

The second converting circuit may include an exponential part takeout unit for taking out an exponential part of the input y and an output unit for outputting an absolute value of the maximum integer not exceeding a value corresponding to division by N of the exponential part as taken out, with a real number $a=2^N$, N being a positive integer. In case the input y is expressed by a floating binary point number, a representative integer value may be output based on the value of the so taken out exponential part value.

In another embodiment, the present invention provides a decoding apparatus for decoding the low density parity check code using a message passing algorithm configured for propagating messages between a number of check nodes and a number of variable nodes, the check and variable nodes corresponding to the low density parity check code. The message is set as a log likelihood ratio having, as a base, a real number a which is a power of 2. The decoding apparatus includes a check node processing calculating unit for receiving a first message delivered from a variable node to a check node to calculate a second message delivered from the check node to the variable node, and a variable node processing calculating unit for receiving the second message calculated by the check node processing calculating unit to calculate the first message. The check node processing calculating unit includes a first converting circuit for converting an absolute value x of the first message into a value of the power of 2 to output the value, and a second converting circuit for subdividing an input y into a number of domains having boundary values prescribed with powers of 2. The input value y is a sum of values converted by the first converting circuit from absolute values x of the first message from the totality of the variable nodes less one variable node. The second converting circuit converts the numbers in the domain into integers.

Thus, in the second converting circuit for subdividing the input y and for converting the numbers in the domains into representative values, according to the present invention, it readily be may verified to which domain belongs the input y, thus simplifying the calculations in the second converting circuit or the circuit configuration.

In yet another embodiment, the present invention provides an information processing apparatus for reproducing data encoded into the low density parity check code, which code is recorded, in which the apparatus includes reproducing part a for reading out data encoded into and recorded as the low density parity check code, and for decoding and reproducing the data using a message passing algorithm configured for propagating a message between a number of check nodes and a number of variable nodes, with the check and variable nodes corresponding to the low density parity check code, wherein the reproducing part sets the message as a log likelihood ratio having a real number a, which is a power of 2, as a base. The information processing apparatus includes a check node processing calculating unit for receiving a first message delivered from a variable node to a check node to calculate a second message delivered from the check node to the variable node, and a variable node processing calculating unit for receiving the second message calculated by the check node processing calculating unit to calculate the first message. The check node processing calculating unit includes a first converting circuit for converting an absolute value x of the first message into a value of the power of 2 to output the value.

With the decoding method and apparatus, according to the present invention, the low density parity check code is decoded using a message passing algorithm in which messages are propagated between multiple check nodes and multiple variable nodes, with the nodes corresponding to the low density parity check matrix. The messages are calculated by the check node processing calculating unit or step for receiving a first message delivered from a variable node to a check node to calculate a second message delivered from the check node to the variable node, and by the variable node processing calculating unit for receiving the second message calculated by the check node processing calculating unit or step to calculate the first message. The check node processing calculating unit includes a first converting circuit for converting an absolute value x of the first message into a value of the power of 2, which value is output, and a second converting circuit for subdividing an input y into a number of domains having boundary values prescribed with powers of 2. The input value y is a sum of values converted by the first converting circuit from absolute values x of the first message from the totality of the variable nodes less one variable node, with the second converting circuit converting the numbers in the domain into integers. By expressing at least one of the boundary values of the domains of the input y and the output of the first converting circuit or step by powers of 2, as values suited for binary expression, it is possible to simplify the calculations or the circuit of the check node processing circuit.

With the information processing method and apparatus, according to the present invention, the calculations or the circuit configuration of the calculating units may be simplified by employing the above-described decoding method or the decoding apparatus for the LDPC code.

Additional features and advantages of the present invention are described in, and will be apparent from, the following Detailed Description of the Invention and the Figures.

BRIEF DESCRIPTION OF THE FIGURES

FIG. 1 shows a parity check matrix of a binary LDPC code.

DETAILED DESCRIPTION OF THE INVENTION

Referring to the Figures, a preferred embodiment of the present invention is explained in detail. In the preferred embodiment, the present invention is applied to a decoding apparatus with a simplified circuit configuration of a check node processing calculating unit for detecting the LDPC code using a message passing algorithm, and a variety of information processing apparatus provided with the decoding apparatus.

Specifically, the present invention uses special artifices in calculating a function f in calculating a message from a check node to a bit node, and an inverse function thereof. However, for permitting facilitated understanding of the present invention, the code detecting method by the message passing algorithm is to be explained before proceeding to describe the calculating method.

(1) Parity Check Matrix

FIG. 1 shows a 7-row 21-column parity check matrix. This parity check matrix, shown in FIG. 1, has a rank equal to 6, and the codes thereby determined is a linear code with the code length N=21 and with the dimension K=15. The matrix shown is a regular LDPC code in which the number of non-zero elements, that is, 1, in each row is constant at 6 and in which the number of non-zero elements, that is, 1, in each column is constant at 2.

Figure 2:
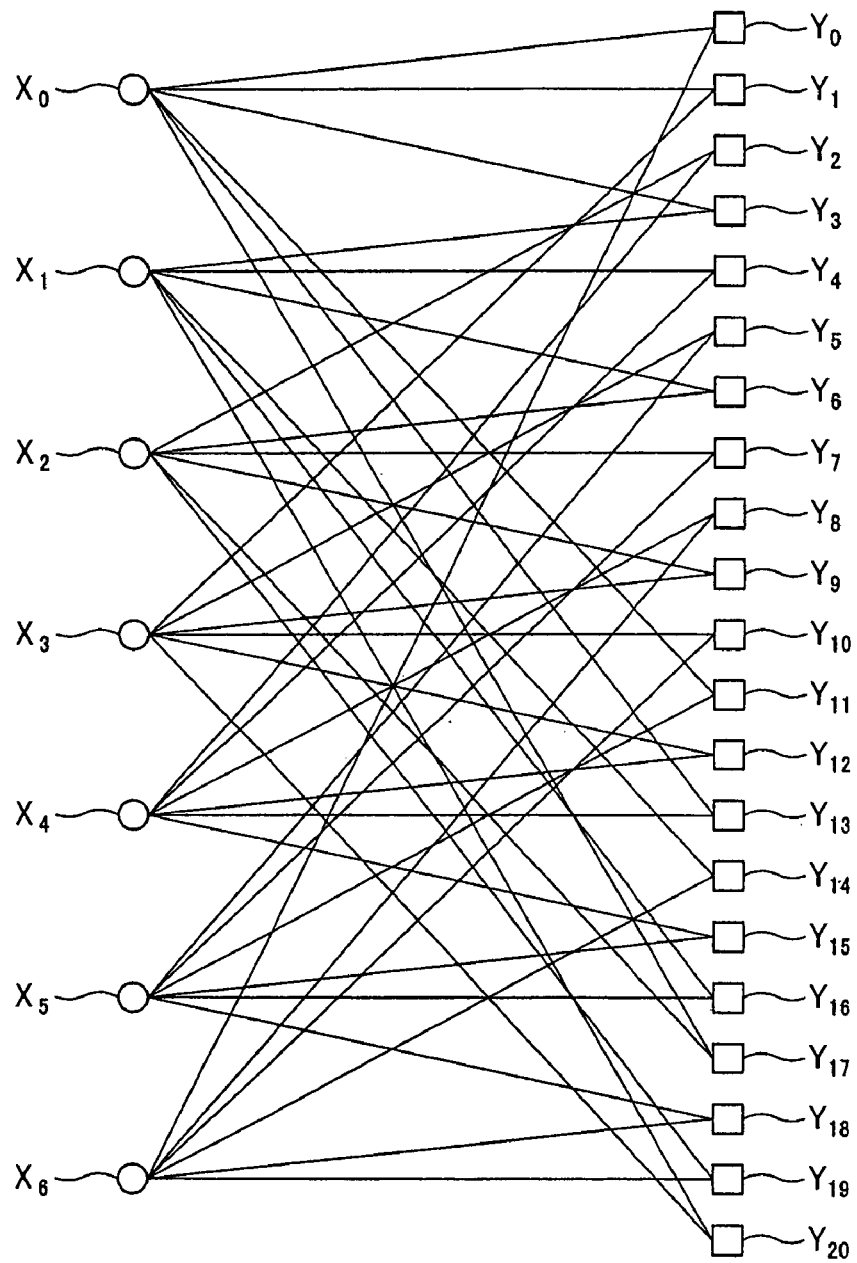
FIG. 2 depicts a bipartite graph associated with the parity check matrix shown in FIG. 1.

FIG. 2 depicts a bipartite graph for the parity check matrix shown in FIG. 1. Referring to FIG. 2, the bipartite graph, representing the M-row N-matrix parity check matrix, is made up by M nodes for check (check nodes $X_m$), N nodes for variables (bit nodes (nodes of variables) $Y_n$) and by edges interconnecting the check nodes $X_m$ and the bit nodes $Y_n$. The edge is associated with a site of the non-zero element of the parity check matrix such that, only when the m-row n-column element is not zero, the n'th check node $X_m$ and the n'th bit node $Y_n$ are interconnected by an edge.

(2) Message Passing Algorithm

For assuring more facilitated understanding of the present invention, the code detection method of the LDPC codes by the usual message passing algorithm, consisting in propagating the message between the check node $X_m$ and the bit node $Y_n$, interconnected by an edge, is first explained. The code detection of the LDPC code by the message passing algorithm may be achieved by iterating the following sequential operations:

[1] Operation 0—Initializing

For all edges, emanating from the respective bit nodes $Y_n$, the messages $q^0_{m,n}$ and $q^1_{m,n}$, propagated from the bit node $Y_n$ to the check node $X_m$, are initialized to the priori probability $p^0_n$, $p^1_n$. It is noted that $p^x n$ denotes the priori probability for the bit n being "x".

[2] Operation 1—Processing at the Check Nodes

For the totality of the edges, emanating from the check nodes $X_m$, the messages $r^0_{m,n}$ and $r^1_{m,n}$, propagated from the check node $X_m$ to the bit node $Y_n$, are found in accordance with the following equations:

$$r^0_{m,n} = \frac{1 + \prod_{n' \in N(m)\backslash n}(q^0_{m,n'} - q^1_{m,n'})}{2} \quad (2\text{-}1)$$

$$r^1_{m,n} = \frac{1 - \prod_{n' \in N(m)\backslash n}(q^0_{m,n'} - q^1_{m,n'})}{2} \quad (2\text{-}2)$$

where

N(m): the column numbers of non-zero elements in an m'th column of the parity check matrix X\y: set obtained on eliminating elements y from a set X.

[3] Operation 2—Processing in a Bit Node

The posteriori probability of the respective bits $q^0_n$ and $q^1_n$ of the respective bits are found as necessary from the following equation:

$$q^0_n = a_n p^0_n \prod_{m \in M(n)} r^0_{m,n} \quad (3\text{-}1)$$

$$q^1_n = a_n p^1_n \prod_{m \in M(n)} r^1_{m,n} \quad (3\text{-}2)$$

where

M(n): column numbers of non-zero elements in an n'th column of the parity check matrix $a_n$: normalizing constant for setting $q^0_n + q^1_n = 1$.

In case further iterations are needed, the messages propagated from the bit node $Y_n$ to the check node $X_m$ are calculated in accordance with the following equations:

$$q^0_{m,n} = a_{m,n} p^0_n \prod_{m' \in M(n)\backslash m} r^0_{m',n} \quad (4\text{-}1)$$

$$q^1_{m,n} = a_{m,n} p^1_n \prod_{m' \in M(n)\backslash m} r^1_{m',n} \quad (4\text{-}2)$$

where $a_{m,n}$: normalizing constant for setting $q^0_{m,n} + q^1_{m,n} = 1$.

With regard to the decoding by the message passing algorithm, the operations 1 and 2 are iterated until the conditions for termination are met, and ultimately the information word is estimated by hard decision decoding. Customarily, the conditions for termination are:

1) that the number of times of iteration has reached the preset value; and
2) that, if the number of times of iteration has not reached the preset value, but the result of hard decision has satisfied the parity check condition. The parity check is represented by the following equation (5):

If the result of hard decision: ĉ

$$\text{the parity check:} H\hat{c}=0 \tag{5}$$

Figure 3:
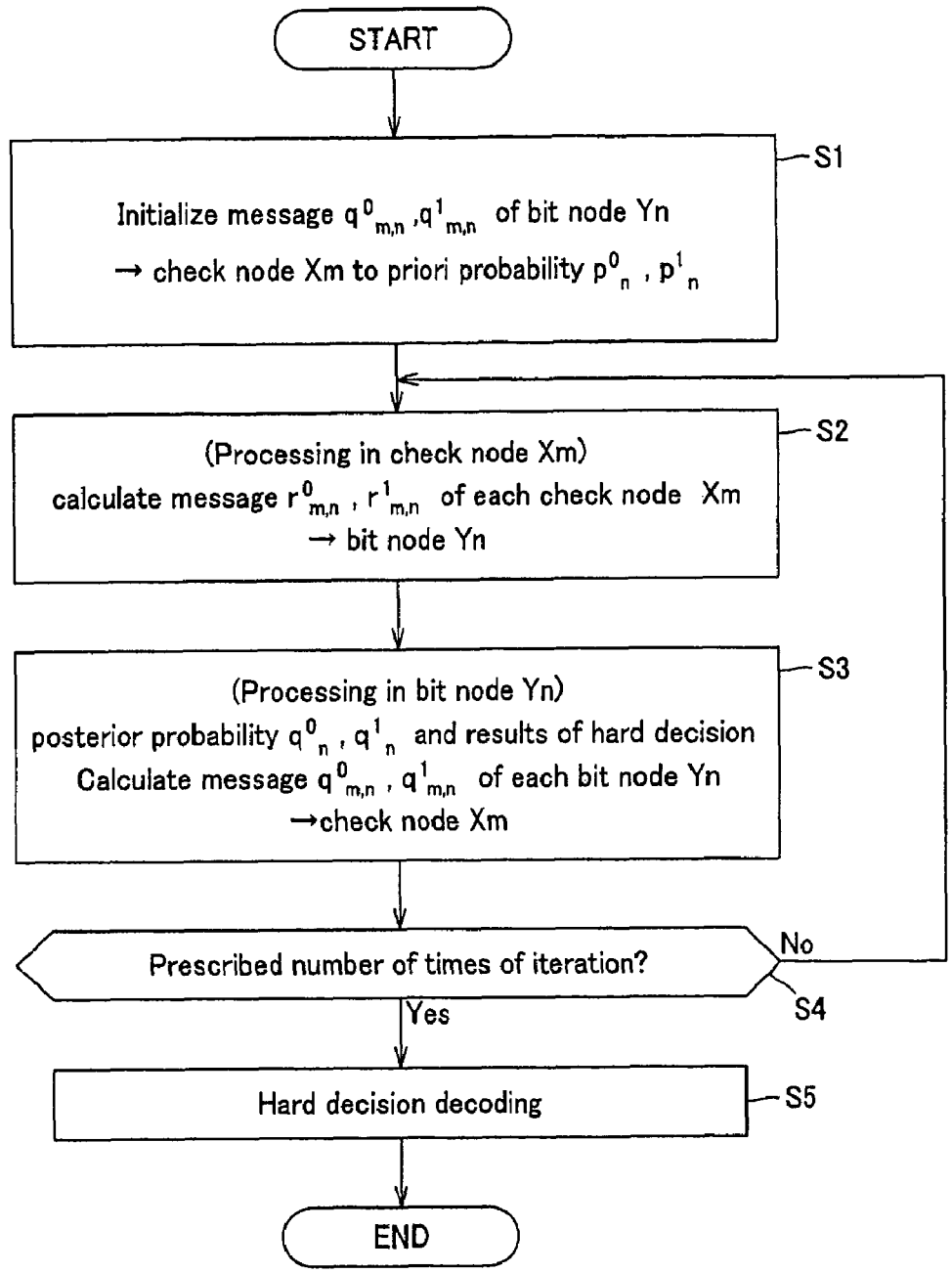
FIG. 3 is a flowchart for illustrating an iterative decoding method (message passing algorithm) of propagating messages between a check node $X_m$ and a bit node $Y_n$.

FIG. 3 depicts the flowchart of the decoding algorithm in case the condition for termination is 1) above that is, as shown in FIG. 3, the messages $q^0_{m,n}$ and $q^1_{m,n}$, from the bit node $Y_n$ to the check node $X_m$, are initialized to the priori probability $p^0_n$ and $p^1_n$ (step S1: operation 0).

The messages $r^0_{m,n}$ and $r^1_{m,n}$, from each check node $X_m$ to the bit node $Y_n$, are then calculated (step S2: operation 1).

At each bit node $Y_n$, the posteriori probability $q^0_n$ and $q^1_n$ and the result of hard decision ĉ is calculated, and the messages $q^0_{m,n}$ and $q^1_{m,n}$, to the check node $X_m$ are then calculated (step S3, operation 2).

It is then checked whether or not the prescribed number of times of iteration has been reached (step S4). In case the prescribed number of times of iteration has not been reached, the processing of the steps S2 and S3 is repeated. In case the prescribed number of times of iteration has been reached, hard decision decoding is carried out (step S5) to terminate the processing. In case the preset number of times of reiteration has not been reached but the result of hard decision ĉ has met the parity check H ĉ=0, the processing may similarly be terminated.

If, as a calculating method equivalent to the above algorithm, the log likelihood ratio LLR is used for conversion to a log domain calculating equation, the calculations corresponding to the multiplication may all be replaced by addition, thus simplifying the processing on hardware or software. The algorithm of the calculations in the log area is shown as follows:

[1] Operation 0—Initializing

For all edges, emanating from the respective bit nodes $Y_n$, the message $Q_{m,n}$, propagated from the bit node $Y_n$, is initialized with the priori log likelihood ratio $P_n$ of each bit. It is noted that the message $Q_{m,n}$ and the priori log likelihood ratio $P_n$ of each bit are defined as in the following equations (6-1) and (6-2):

$$Q_{m,n} \equiv \ln(q^0_{m,n}/q^1_{m,n}) \tag{6-1}$$

$$P_n \equiv \ln(p^0_n/p^1_n) \tag{6-2}$$

[2] Operation 1—Processing

For the totality of edges, emanating from the check nodes $X_m$, the messages $R_{m,n}$, propagating the edges, are calculated by the following equation (7-1), where $A_m$, $B_m$ and the message $R_{m,n}$ are defined as shown by the equations (7-2) to (7-4) and the functions f, g, $\alpha_{m,n}$ and $\beta_{m,n}$ are represented by the following equations (7-5) to (7-8):

$$R_{m,n} = \left(\prod_{n' \in N(m) \backslash n} \alpha_{m,n'}\right) g\left(\sum_{n' \in N(m) \backslash n} f(\beta_{m,n'})\right)$$

$$= (A_m / \alpha_{m,n}) g(B_m - f(\beta_{m,n})) \tag{7-1}$$

-continued $$A_m \equiv \prod_{n' \in N(m)} \alpha_{m,n'} \tag{7-2}$$

$$B_m \equiv \sum_{n' \in N(m)} f(\beta_{m,n'}) \tag{7-3}$$

$$\text{messages } R_{m,n} \equiv \ln(r^0_{m,n}/r^1_{m,n}) \tag{7-4}$$

$$f(x) = \ln\frac{e^x+1}{e^x-1} = -\ln\tanh(x/2) \tag{7-5}$$

$$g(x) = -\ln\tan h(x/2) : \text{inverse function of function } f \tag{7-6}$$

$$\alpha_{m,n}: \text{code part of } Q_{m,n} \tag{7-7}$$

$$\beta_{m,n}: \text{absolute value of } Q_{m,n} \tag{7-8}$$

[3] Operation 2—Processing in the Bit Node

The posterior log likelihood ratio $Q_n$ of each bit, defined by the following equation (8):

$$Q_n \equiv \ln(q^0_n/q^1_n) \tag{8}$$

is found from the following equation (9):

posteriori value:

$$Q_n = P_n + \sum_{m \in M(n)} R_{m,n} \tag{9}$$

In case further iterations are necessary, the message $Q_{m,n}$, propagated from the bit node $Y_n$ to the check node $X_m$ is calculated in accordance with the following equation (10):

$$Q_{m,n} = P_n + \sum_{m' \in M(n) \backslash m} R_{m',n} = Q_n - R_{m,n} \tag{10}$$

It is noted that the following interpretation may be made of the physical meaning of $A_m$ and $B_m$ as used in finding the message $R_{m,n}$ from the check node $X_m$ to the bit node $Y_n$, defined by the above equations (7-2) and (7-3). That is, $A_m$ ($B_m$) may be calculated and written as in the following equation (12):

$$A_m f(B_m) = \left(\prod_{n' \in N(m)} \alpha_{m,n'}\right) f\left(\sum_{n' \in N(m)} f(\beta_{m,n'})\right) \tag{12}$$

$$= \ln\frac{1 + \prod_{n' \in N(m)}(q^0_{m,n'} - q^1_{m,n'})}{1 - \prod_{n' \in N(m)}(q^0_{m,n'} - q^1_{m,n'})}$$

$$= \ln(r^0_m/r^1_m)$$

where $r^0_m$ and $r^1_m$ are defined as shown in the following equations (13-1) and (13-2):

$$r^0_m = \frac{1 + \prod_{n' \in N(m)} (q^0_{m,n'} - q^1_{m,n'})}{2} \quad (13\text{-}1)$$

$$r^1_m = \frac{1 - \prod_{n' \in N(m)} (q^0_{m,n'} - q^1_{m,n'})}{2} \quad (13\text{-}2)$$

In case the message $q^0_{m,n}$ and $q^1_{m,n}$, from the bit node $Y_n$ to the check node $X_m$ is as shown by the following equations (14-1) and (14-2), $r^0_m$ of the above equation (13-1) corresponds to the probability satisfying the check.

Probability of each bit $n \in N(m)$ being 0:

$$q^0_{m,n} \quad (14\text{-}1)$$

Probability of each bit $n \in N(m)$ being 1:

$$q^1_{m,n} = 1 - q^0_{m,n} \quad (14\text{-}2)$$

That is, $A_m$ and $B_m$ represent an indirect expression of the probability of meeting the check which is based on the message $Q_{m,n}$ or $q^0_{m,n}$ and $q^1_{m,n}$ from each bit node $Y_n$ ($n \in N(m)$) to the check node $X_m$.

Figure 4:
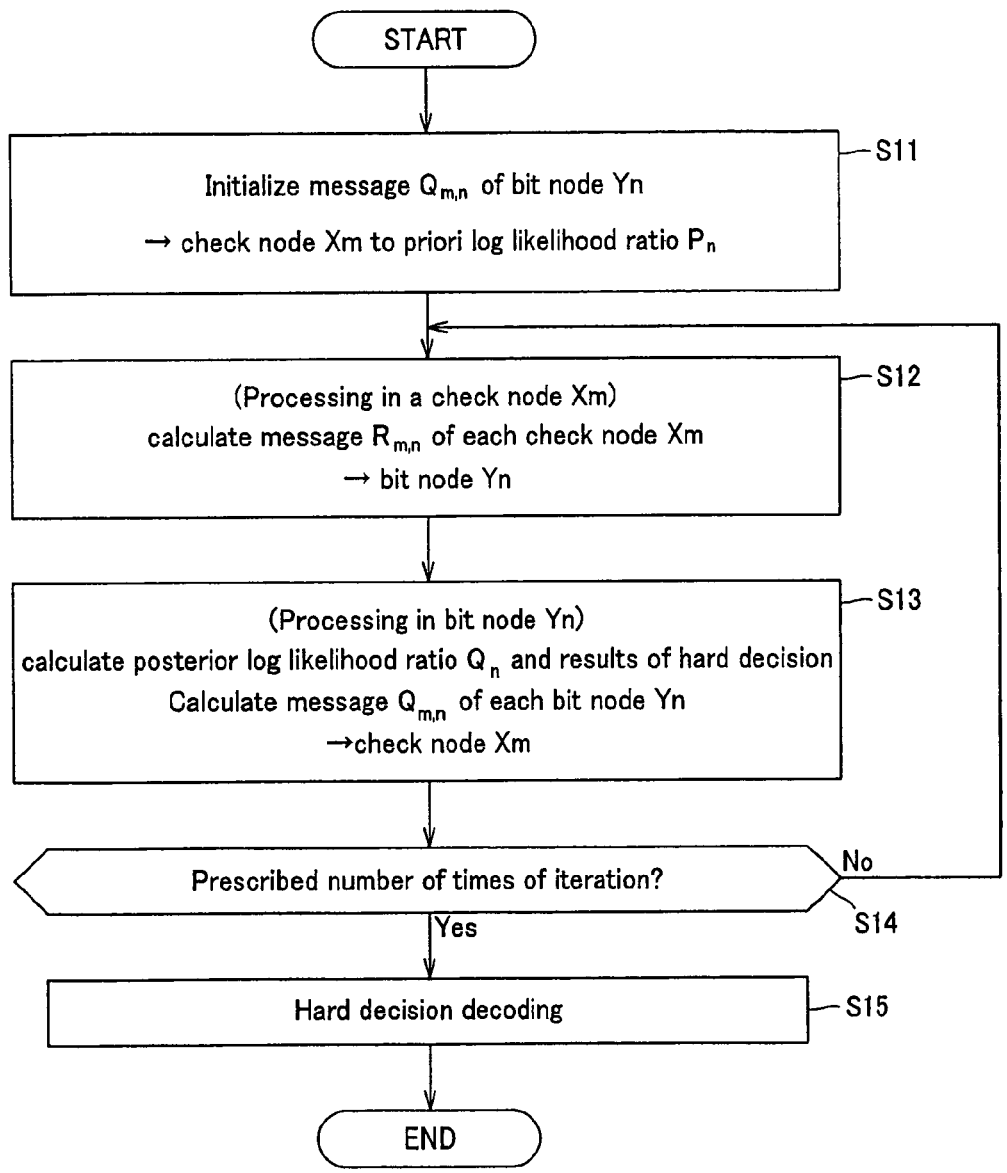
FIG. 4 is a flowchart for illustrating an iterative decoding method (message passing algorithm) of propagating messages between a check node $X_m$ and a bit node $Y_n$, and specifically illustrating a decoding method in case of employing a log likelihood ratio.

FIG. 4 depicts a flowchart of the decoding algorithm in case the above log likelihood ratio is used and the condition for termination is the above 1), that is, that the number of times of iteration of the operations 1 and 2 has reached the preset value. That is, as shown in FIG. 4, the message $Q_{m,n}$ from the bit node $Y_n$ to the check node $X_m$ is initialized with the priori log likelihood ratio $P_n$ (step S11: operation 1).

The message $R_{m,n}$ from each check node $X_m$ to the bit node $Y_n$ is then calculated (step S12: operation 1).

Then, in each bit node $Y_n$, the posteriori log likelihood ratio $Q_n$ and the result of hard decision $\hat{c}$ are calculated, and the message $Q_{m,n}$ to the check node $X_m$ is calculated (step S13: operation 2).

It is then checked whether or not the preset number of times of iteration has been reached (step S14). In case the prescribed number of times of iteration has not been reached, the processing of the steps S12 and S13 is repeated. In case the prescribed number of times of iteration has been exceeded, hard decision decoding is carried out (step S15) to terminate the processing. In case the preset number of times of reiteration has not been reached but the result of hard decision $\hat{c}$ has met the parity check $H \hat{c} = 0$, the processing similarly may be terminated.

(3) Embodiment

Figure 5:
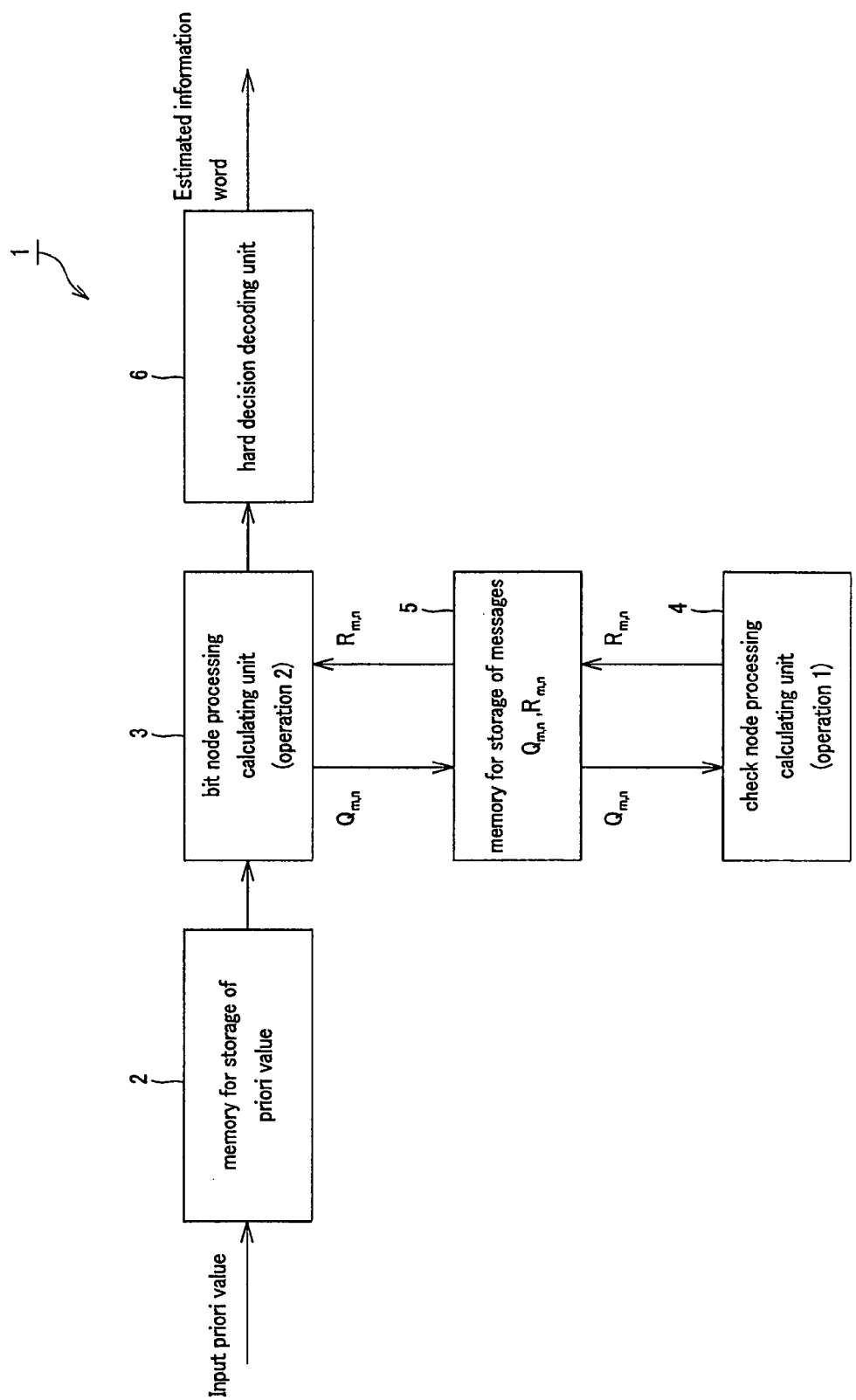
FIG. 5 is a block diagram showing a decoding apparatus embodying the present invention.

An embodiment of the present invention is now explained in detail. First, a specified example of a decoding apparatus, decoding the LDCP codes by iterating the calculations of the above operations 1 and 2, is explained. FIG. 5 depicts a block diagram showing a decoding apparatus embodying the present invention.

Referring to FIG. 5, the decoding apparatus 1 is made up by a memory 2, supplied with and holding a priori value, a bit node processing calculating unit 3 carrying out calculations in the bit node $Y_n$, a check node processing calculating unit 4 carrying out calculations for the check node $X_m$, a memory 5 for storage of a message $Q_{m,n}$ from the bit node $Y_n$ to the check node $X_m$ and a message $R_{m,n}$ from the check node $X_m$ to the bit node $Y_n$, and a hard decision decoding unit 6 for carrying out hard decision decoding responsive to the result of the bit node processing calculating unit 3 to output an estimated information word. This decoding apparatus 1 uses the same calculating unit for each iterative operation. Moreover, the respective calculating units time-divisionally perform the processing of multiple nodes.

The LDCP code decoding apparatus 1 is supplied with a noise-corrupted received word or the replay signal, which is stored in the memory 2 holding the priori values. A message is iteratively propagated between the bit node processing calculating unit 3 performing the processing of the operation 2 and the check node processing calculating unit 4 performing the processing of the operation 1, through the memory 5 adapted for holding the message, and finally the hard decoding decision is carried out by the hard decision decoding unit 6 to estimate the information word. Meanwhile, the initializing processing or the decision unit for verifying the condition of terminating the iteration is omitted in FIG. 5.

In FIG. 5, the memory 5 holds the message $Q_{m,n}$ from the bit node $Y_n$ to the check node $X_m$ and the message $R_{m,n}$ from the check node $X_m$ to the bit node $Y_n$. However, a memory for holding the message $Q_{m,n}$ may be provided separately from a memory for holding the message $R_{m,n}$.

Figure 6:
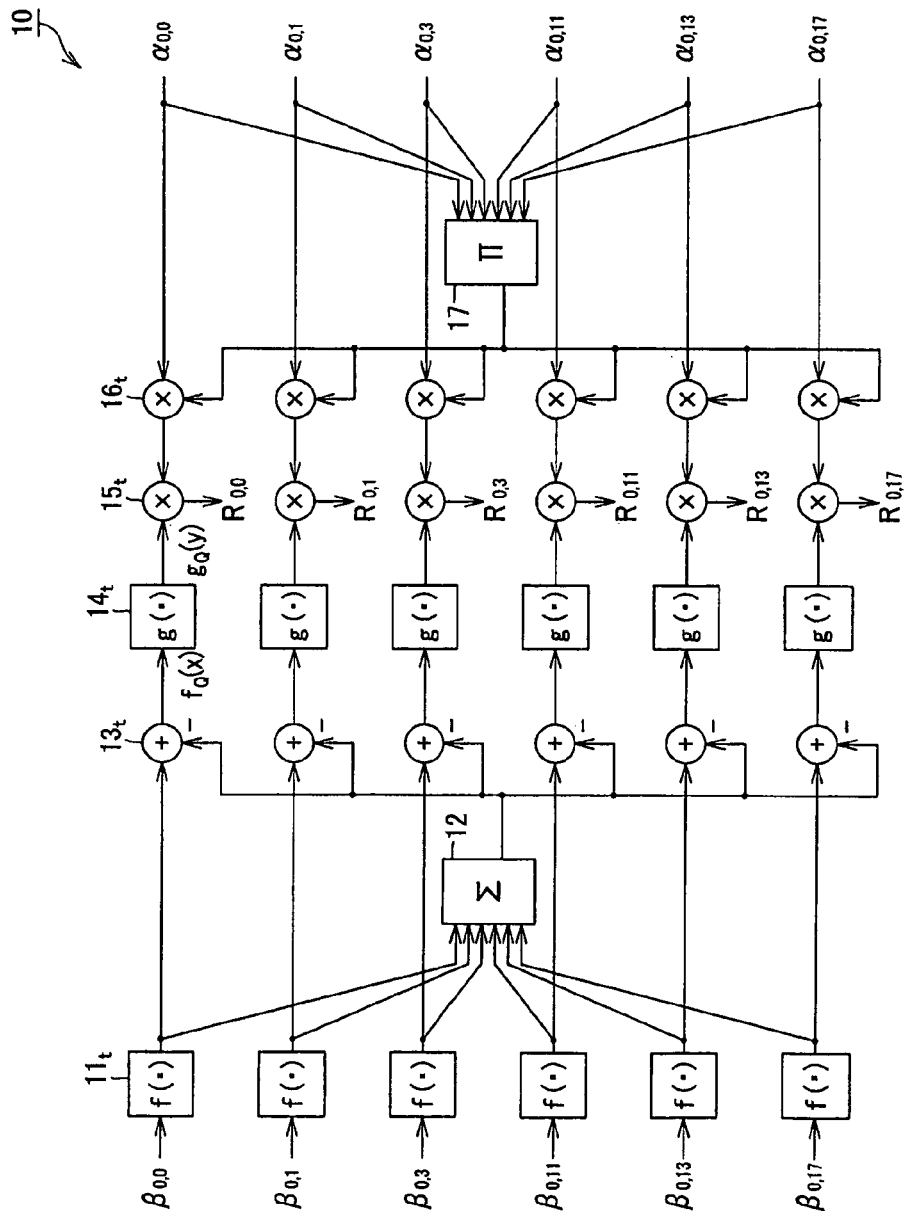
FIG. 6 is a circuit diagram showing an example of major portions of a check node processing calculating unit.

FIG. 6 depicts a circuit diagram showing an example of major portions of the check node processing calculating unit. Here, an example of a calculating unit for the check of the first row of the parity check matrix, shown in FIG. 1, is specifically shown.

Figure 26:
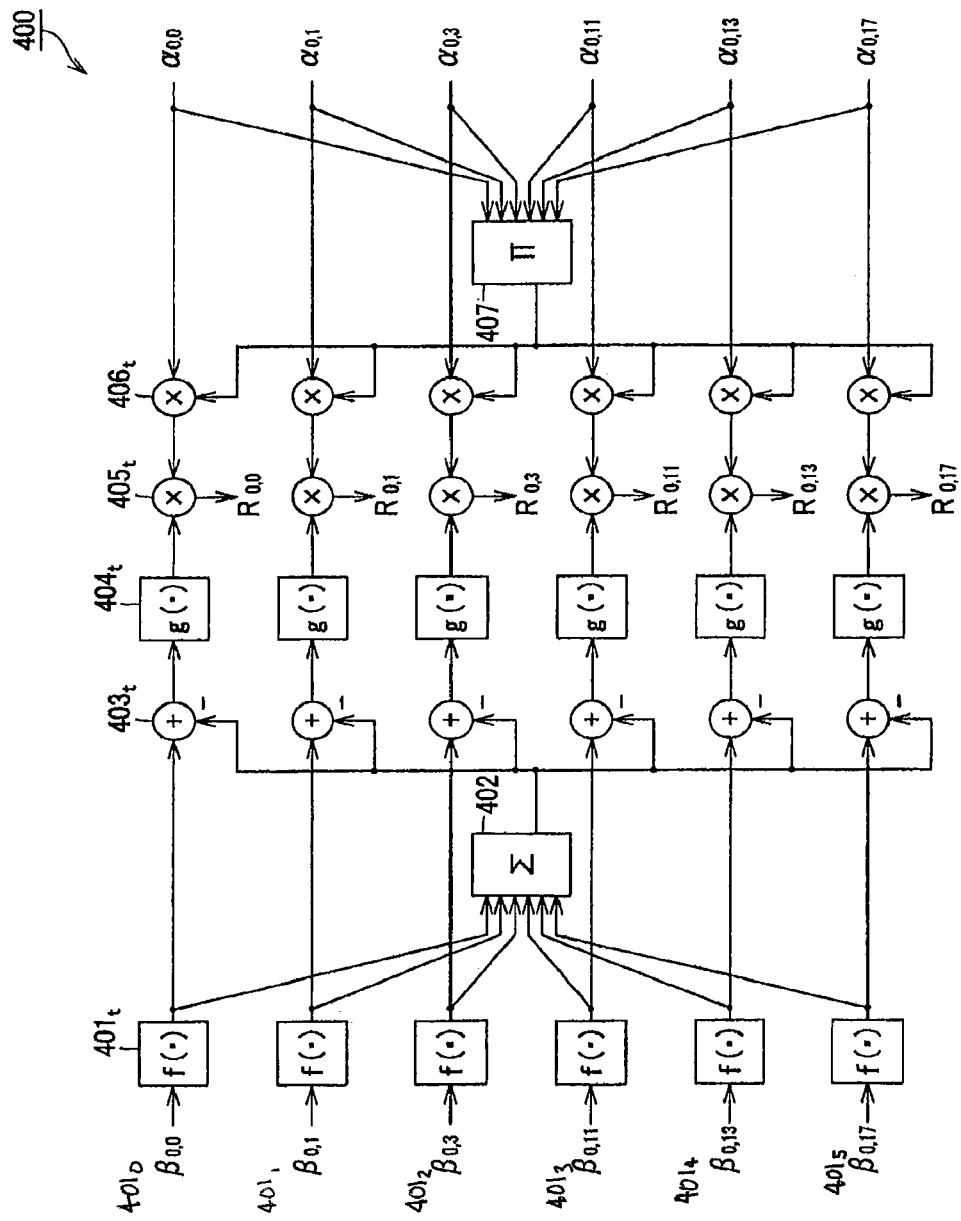
FIG. 26 is a circuit diagram showing an example of major parts of a conventional check node processing calculating unit.

In FIG. 6, a check node processing calculating unit 10 includes a converter $11t$ ($11_0$ to $11_5$ in FIG. 26) for transforming absolute values $\beta_{m,n}$ of the message $Q_{m,n}$ at a corresponding location to a function f, an adder 12 for finding $B_m$, representing the sum thereof, an adder $13_t$ for subtracting the function f obtained from the messages $Q_{m,n}$, corresponding to $B_{m,n}$ of the corresponding message $Q_{m,n}$, a converter $14_t$, as a second converting circuit, for transforming an output of the adder $13_t$ into a function g, a multiplier 17 for multiplying the totality of codes $\alpha_{m,n}$ of the message $Q_{m,n}$ to find $A_m$ shown in the above equation (7-2), a multiplier $16t$ for multiplying an output ($A_m$) of the multiplier 17 with the code $\alpha_{m,n}$ of the corresponding message $Q_{m,n}$, and a multiplier $15t$ for multiplying the outputs of the converters $14t$ and $16t$ to output the message $R_{m,n}$.

For example, the converter $11_t$ finds a transformed value of the absolute values $\beta_{m,n}$ of the message $Q_{m,n}$ from the totality of the bit nodes connected to a check node, and the adder 12 finds the sum total of the values. This sum total $B_m$ less only the transformed value by the converter $11_t$ of the absolute values $\beta_{m,n}$ of the message $Q_{m,n}$ of the preset bit node, to which the message is delivered from the above check node, becomes an input y to the converter $14_t$. Thus, the message $R_{m,n}$, delivered to the preset node, is output from the multiplier $15_t$. Specifically, for the parity check matrix, shown in FIG. 1, the adder $13_0$ subtracts only the value transformed from the absolute values $\beta_{0,0}$ of the message $Q_{0,0}$ from $B_m$ output from the adder 12 to send the resulting value to the converter $14_0$. The message $R_{0,0}$, output to the first bit node Y0, is output from the output via multiplier $15_0$.

The message $Q_{m,n}$ entered to the check node processing calculating unit 10 is represented as the log likelihood ratio. For substituting the calculations corresponding to the addition of the equation (7-1) or the equations (7-1), (7-3) for the calculations corresponding to the multiplication (2-1), (2-2) for check node processing, this check node processing calculating unit 10 first transforms, by the converter $11_t$, the absolute values $\beta_{m,n}$ of the message $Q_{m,n}$ as the first message, represented by the log likelihood ratio, into a function f. After carrying out preset calculations, the check node processing calculating unit 10 reconverts the value, represented by the form of addition of the function f, into the log likelihood ratio.

In the present embodiment, the configuration of the check node processing calculating unit 4 is simplified by the transform processing by the function f, and by the transform processing by its inverse function g, that is, by converting output values of the converters $11_t$, $14_t$ or boundary values demarcating the input into values that can be handled more readily by circuits or computers. Specifically, the message $Q_{m,n}$ or $R_{m,n}$ is represented by a log likelihood ratio having a real number formed by a power of 2 as a base for approximating the function f by $2Ca^{-x}$, where C is an arbitrary number. The circuit configuration in the check node processing calculating unit 10 is simplified by representing the value $f_Q(x)$, obtained on converting the absolute values $\beta_{m,n}$ of the message $Q_{m,n}$ into an approximate equation of the function f, by a value proper for binary representation (power of 2), by suitably selecting the values of the constant C and the real number a, and by representing, in finding an inverse function $g_Q(y)$ of the approximate equation of the function f, the boundary values of the domain of y outputting the integer value $g_Q(y)$.

The concrete method is now explained in more detail. The converter $11_t$, shown in FIG. 6, uses a preset function to carry out calculations for converting the multiplication of the equations (2-1) and (2-2) into addition of the equations (7-1) or (7-1) and (7-3), while the converter $14_t$ carries out calculations using a function of reverting the results of calculations, carried out following the conversion by the converter $11_t$, into the log likelihood ratio. That is, the converter $11_t$, supplied with the absolute values $\beta_{m,n}$ of the message $Q_{m,n}$, as an input, converts the log likelihood ratio $|\log_a(q^0_{m,n}/q^1_{m,n})|$ into $-C\ln|q^0_{m,n}-q^1_{m,n}|$, using a preset function, while the converter $14_t$, supplied with a sum or difference of an output of the converter $11_t$, as an input, converts $-C\ln|r^0_{m,n}-r^1_{m,n}|$, into the log likelihood ratio $|\log_a(r^0_{m,n}/r^1_{m,n})|$ using an inverse function of the function used for the converter $11_t$.

The conventional function f is defined as in the above equation (7-5). It is seen that, if the function f is expanded by Taylor expansion with $e^{-x}$ and truncated at the term of the first degree, the result is $2e^{-x}$, such that f(x) approaches to $2e^{-x}$ with increase in x.

Figure 7:
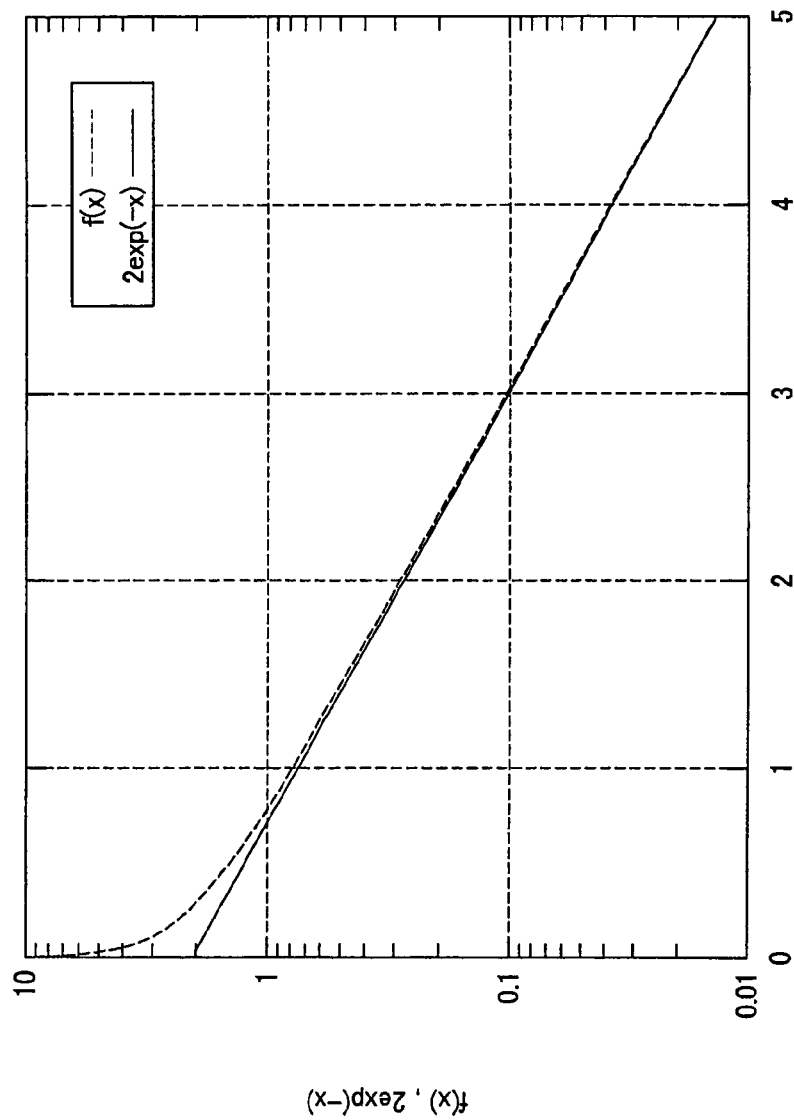
FIG. 7 is a graph showing f(x) and $2e^{-x}$ in case the abscissa is a log axis.

FIG. 7 is a graph showing f(x) and $2e^{-x}$, with the ordinate as the log axis. As may be seen from FIG. 7, f(x) approaches to $2e^{-x}$, with increase in x, thus testifying to good approximation. In general, the log likelihood ratio is re-defined as in the following equations (15-1) to (15-4), where a is an arbitrary real number.

$$P_n \equiv \log_a(p^0_n/p^1_n) \quad (15\text{-}1)$$

$$Q_{m,n} \equiv \log_a(q^0_{m,n}/q^1_{m,n}) \quad (15\text{-}2)$$

$$R_{m,n} \equiv \log_a(r^0_{m,n}/r^1_{m,n}) \quad (15\text{-}3)$$

$$Q_n \equiv \log_a(q^0_n/q^1_n) \quad (15\text{-}4)$$

Figure 8:
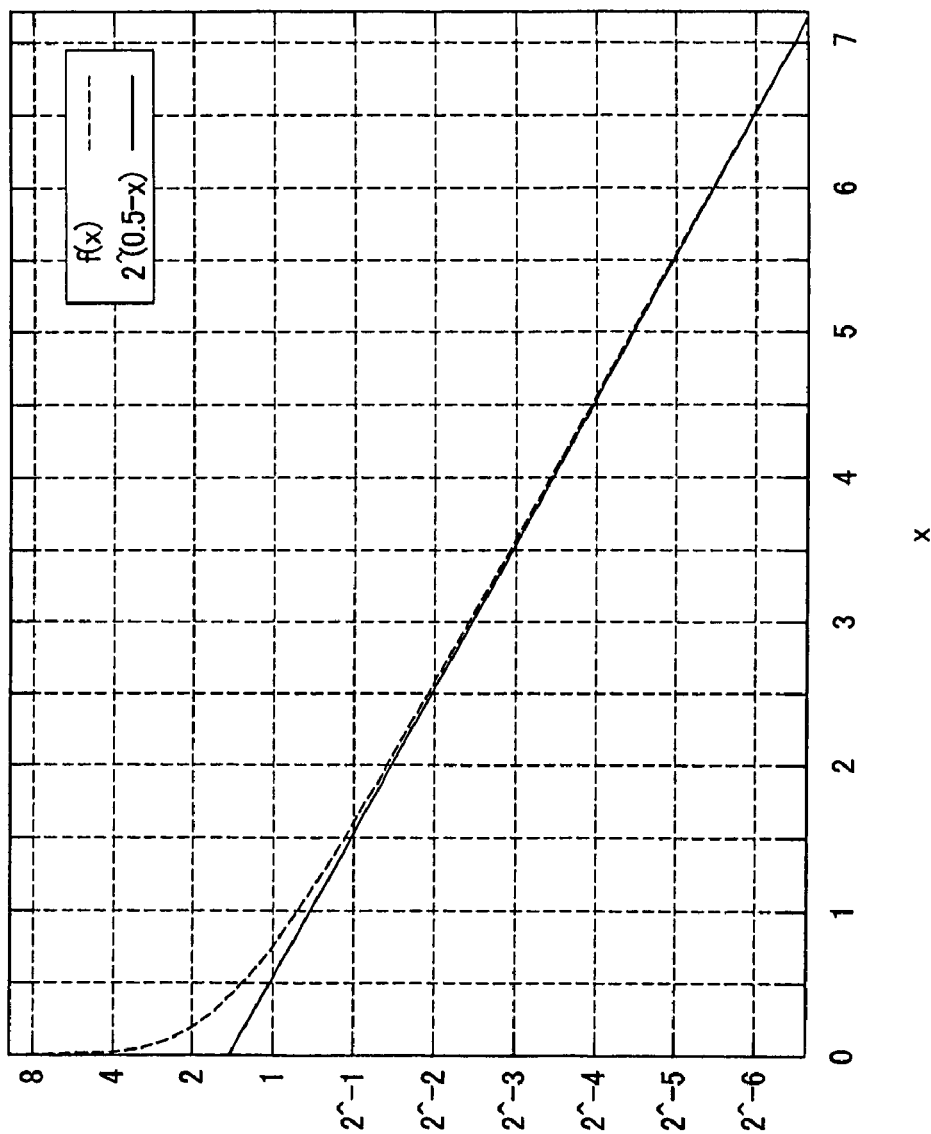
FIG. 8 is a graph showing f(x) and an approximate equation $F(x)=2Ca^{-x}=2^{0.5-x}$ in case a=2 and $C=1/\sqrt{2}(2^{-0.5})$.

That is, the base of the log is converted in its entirety into a real number a. In this case, the function f in the above algorithm may be defined as in the following equation (16):

$$f(x) = C \ln \frac{a^x + 1}{a^x - 1} \quad (16)$$

where C is an arbitrary constant. FIG. 8 is a graph showing f(x) and an approximate equation $F(x)=2Ca^{-x}=2^{0.5-x}$. As may be seen from FIG. 8, f(x) approaches to the approximate equation $F(x)=2Ca^{-x}$, as indicated in the previous discussions.

In the following explanation, this approximate equation of f(x) is termed F(x), as indicated by the following equation (17):

$$f(x) \approx F(x) = 2Ca^{-x} \quad (17)$$

Usually, a fixed decimal point or a floating decimal point is used in representing a number in a circuit or on a computer. In any form of expression, there is a limit to the number of bits used for representing a number and to the accuracy of the number represented (number of bits for the mantissa part and the number of effective digits). Consequently, the number that may be represented by the circuit or the computer is discrete. The approximate equation of the function, represented by the above equation (17), may be defined by a continuous function, however, since the value that can be assumed by x is discrete and finite, the output of the approximate equation F(x) can assume only a finite number of values. In the following, F(x), that assumes a finite number of discrete values, is sometimes written as $f_Q(x)$ by way of making a distinction. It is noted that the effect for the case in which the discrete values that may be assumed by x are any of discrete values including zero and spaced apart at a certain interval differs from that for the case in which the discrete values that may be assumed by x are offset from the discrete values including zero and spaced apart at a certain interval by one-half the above interval. In the present embodiment, it is supposed that this interval is equal to 1. That is, the case where the discrete values are integer numbers and the case of offset by 0.5 (one-half the integer) from the integer are explained.

The converter $11_t$, shown in FIG. 6, converts the absolute values $\beta_{m,n}$ of the message $Q_{m,n}$ (also termed x), by an approximate equation F(x) of the function f, and outputs the so converted value=$f_Q(x)$. On the other hand, the converter $14_t$, supplied with the sum of $f_Q(x)$, as outputs of the converter $11_t$, at other than the corresponding position, as input y, subdivides this input y into preset domains, and converts the values in each domain by an inverse function G(y) (=$F^{-1}(x)$) to output the result as a representative value of each domain=$g_Q(y)$.

The present embodiment contemplates to express the boundary values of each domain of the input y of the converter $14_t$ and the output $f_Q(x)$ of the converter $11_t$ by powers of 2. In order to express these values by the powers of 2, the real number is to be the power of 2 and the value of the constant C is selected properly. Moreover, the values that can be assumed by the messages $Q_{m,n}$, $R_{m,n}$, exchanged between the bit node processing calculating unit and the check node processing calculating unit are set to proper discrete values.

Here, the case in which x, as absolute values $\beta_{m,n}$ of the message $Q_{m,n}$, assumes integer values, as indicated in the following equation (18), is explained.

$$x = \begin{cases} 0 \\ 1 \\ 2 \\ 3 \\ 4 \\ \vdots \end{cases} \quad (18)$$

In case x is an integer, with the constant C=1 and the real number a=4, the approximation $f(x) \approx F(x) = 2^{1-2x}$ may be made. In this case, the converted value $f_Q(x)$ of x may be expressed as indicated by the following equation (19):

$$f_Q(x) = \begin{cases} 2^1, & x = 0 \\ 2^{-1}, & x = 1 \\ 2^{-3}, & x = 2 \\ 2^{-5}, & x = 3 \\ 2^{-7}, & x = 4 \\ \vdots & \end{cases} \quad (19)$$

Since $f_Q(x)$ unexceptionally may be expressed by powers of 2, this case is suited for numerical expression in a circuit or on a computer.

The domain of the input y in case of converting each domain of the input y into representative values $g_Q(y)$ of an integer by G(y) as an inverse transform of the function f may be represented as shown by the following equation (20):

$$g_Q(y) = \begin{cases} 0, & 2^0 \le y \\ 1, & 2^{-2} \le y < 2^0 \\ 2, & 2^{-4} \le y < 2^{-2} \\ 3, & 2^{-6} \le y < 2^{-4} \\ 4, & 2^{-8} \le y < 2^{-6} \\ \vdots & \end{cases} \quad (20)$$

If x is an integer and the real number a is expressed as an even number power of 2, the boundary values of the domain of y in $g_Q(y)$ outputting an integer value and $f_Q(x)$ both may be expressed by powers of 2, subject to proper selection of the constant C. In this case, the constant C may be a power of 2 (power of 0.5×even number), with i and k being an arbitrary integer.

$$\begin{cases} C = 2^{0.5 \times (2i)} \\ a = 2^{(2k)} \end{cases} \quad (21)$$

If, on the other hand, x is an integer, and the real number a is expressed by an odd number power of 2, for example, if a=2, it is not possible to express $f_Q(x)$ and the boundary values of the domain of y in $g_Q(y)$ outputting an integer with the power of 2 simultaneously.

In case x is an integer, the real number a is expressed by an odd number power of 2, and the constant C is 0.5×odd number power of 2, the output $f_Q(x)$ of the converter 11$_t$ cannot be expressed by a power of 2. However, the boundary values of the domain of y in $g_Q(y)$ outputting an integer value can be expressed by a power of 2.

That is, if the constant C=1/√2, as an example, and the real number a=2, the approximate equation of f(x) is $F(x)=2^{-0.5-x}$. If x is an integer, as in the above equation (18), the converted value $f_Q(x)$ is as shown in the following equation (22):

$$f_Q(x) = \begin{cases} 2^{0.5}, & x = 0 \\ 2^{-0.5}, & x = 1 \\ 2^{-1.5}, & x = 2 \\ 2^{-2.5}, & x = 3 \\ 2^{-3.5}, & x = 4 \\ \vdots & \end{cases} \quad (22)$$

such that $f_Q(x)$ cannot be expressed by a power of 2. Thus, in the case of a binary number, the above values cannot be expressed correctly by a finite number of bits.

Figure 9:
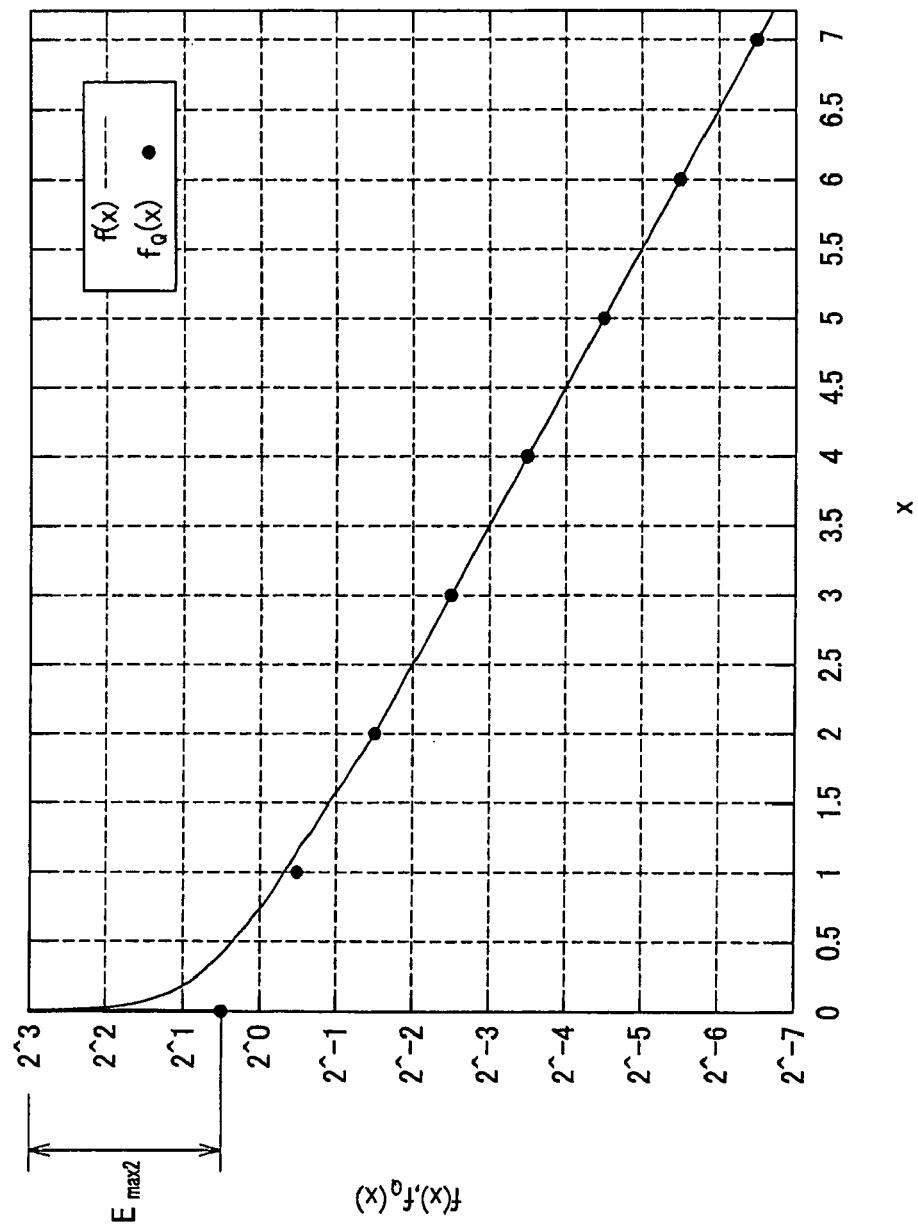
FIG. 9 is a graph showing the relation between an integer x and $f_Q(x)$ in case the abscissa is a log axis, a real number a=2 and a constant $C=1/\sqrt{2}$.

This may be represented by a graph shown in FIG. 9, showing the relation between the integer value x and the converted value $f_Q(x)$ thereof in case the constant C=1/√2 and the real number a=2.

On the other hand, if x is an integer, the real number a is expressed by an odd number power of 2, and the constant C is a 0.5×odd number power of 2, the converted value $f_Q(x)$ thereof cannot be expressed by a power of 2. However, the boundary values of the domain to which belongs y for conversion to an integer $g_Q(y)$ is as in the following equation (23):

$$g_Q(y) = \begin{cases} 0, & 2^0 \le y \\ 1, & 2^{-1} \le y < 2^0 \\ 2, & 2^{-2} \le y < 2^{-1} \\ 3, & 2^{-3} \le y < 2^{-2} \\ 4, & 2^{-4} \le y < 2^{-3} \\ \vdots & \end{cases} \quad (23)$$

such that it may be expressed by the power of 2.

Figure 10:
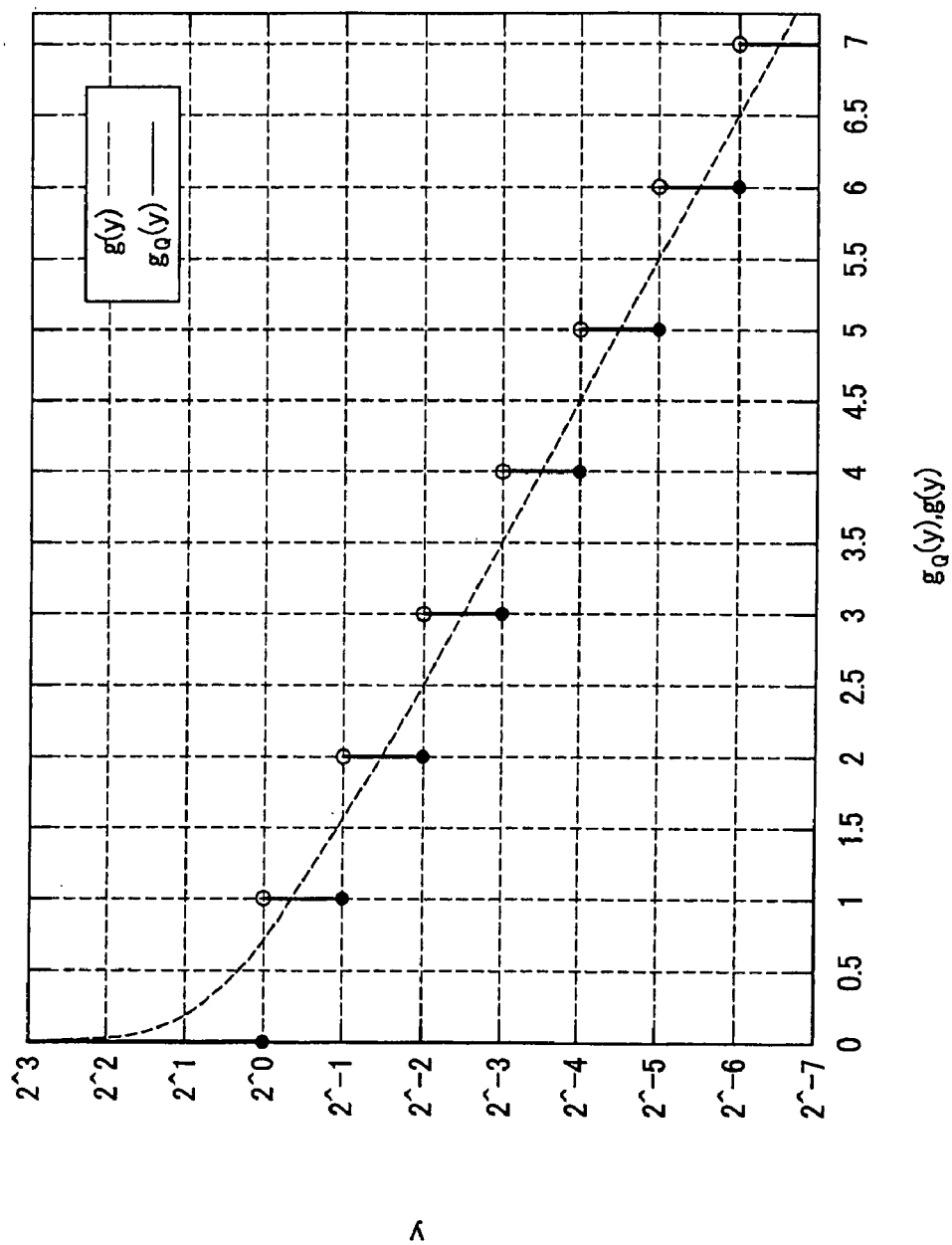
FIG. 10 is a graph showing the relation between $g_Q(y)$ and the corresponding y domain in case the abscissa is a log axis, a real number a=2 and a constant $C=1/\sqrt{2}$.

This may be represented by a graph shown in FIG. 10, showing the relation between the integer value $g_Q(y)$ and the associated domain of y in case the constant C=1/√2 and the real number a=2.

If, similarly, x is an integer value, the real number a is expressed by an odd number power of 2 and the constant C is a power of 2 (power of 0.5×even number), the converted value $f_Q(x)$ of the integer x may be represented by the power of 2. However, the boundary values of each domain of y for conversion into $g_Q(y)$ cannot be expressed by a power of 2.

That is, if, for example, the constant C=1 and the real number a=2, the approximate equation F(x) of f(x) is such that $F(x)=2^{1-x}$. If x is an integer, as in the equation (18), its converted value $f_Q(x)$ may be expressed by the power of 2, as indicated by the following equation (24):

$$f_Q(x) = \begin{cases} 2^1, & x = 0 \\ 2^0, & x = 1 \\ 2^{-1}, & x = 2 \\ 2^{-2}, & x = 3 \\ 2^{-3}, & x = 4 \\ \vdots & \end{cases} \quad (24)$$

On the other hand, the boundary values of the domain to which belongs y for conversion to an integer $g_Q(y)$ is as in the following equation (25):

$$g_Q(y) = \begin{cases} 0, & 2^{0.5} \le y \\ 1, & 2^{-0.5} \le y < 2^{0.5} \\ 2, & 2^{-1.5} \le y < 2^{-0.5} \\ 3, & 2^{-2.5} \le y < 2^{-1.5} \\ 4, & 2^{-3.5} \le y < 2^{-2.5} \\ \vdots & \end{cases} \quad (25)$$

such that it cannot be expressed by the power of 2. If the boundary values of each domain is not the power of 2, the circuit for verifying the domain to which belongs y becomes extremely complex, as indicated by the following equation (25).

Thus, if the constant C is selected such that the converted value of the $f_Q(x)$ of the integer x is a power of 2, the boundary values of each domain to which belongs the input y converted into an integer $g_Q(y)$ may not be expressed by the power of 2, whereas, if the boundary values of the domain of the input y converted into the integer $g_Q(y)$ may be expressed by the power of 2, the value of $f_Q(x)$ may not be expressed by the power of 2. Thus, if any of the values is to be expressed with a power of 2, it is mandatory that the real number "a" be an even number power of 2 and that a proper constant C be selected.

That is, in the case where one of $f_Q(x)$ and $g_Q(y)$ cannot be expressed with a power of 2, in distinction form the case where both of $f_Q(x)$ and $g_Q(y)$ can be expressed with the power of 2, the circuit for outputting $f_Q(x)$ and $g_Q(y)$ is complex in configuration. In such case, in order to prevent the circuit outputting $f_Q(x)$ and $g_Q(y)$ from becoming complex and to simplify the calculations, it may be considered to use a proper approximate value if the boundary values of the domain of y, for example, cannot be expressed with the power of 2. However, if an error by approximation becomes large or if a value other than the power of 2 is used as an approximate value of the boundary values, the circuit for deciding on the domain to which belongs y (FIG. 27 described above) becomes more complex than the circuit in which the boundary values are a power of 2, such as the circuit of FIG. 14. It is therefore more desirable that both the output $f_Q(x)$ of the converter 11$_t$ and the boundary values indicating each domain to which belongs the input y of the converter 14$_t$ may be expressible with the power of 2.

As a result of perseverant searches, the present inventors have found that both the converted value $f_Q(x)$ of the absolute values $\beta_{m,n}$ of the message and the boundary values of each domain to which belongs y that can be converted into the integer $g_Q(y)$ be expressible with the power of 2, if the real number is a power of 2, regardless of whether it is an odd number power of 2 or an even number power of 2, by offsetting the absolute value of the message $Q_{m,n}$ from the integer by 0.5. With this method, the absolute values $\beta_{m,n}$ of the message $Q_{m,n}$ assumes a value offset by 0.5 from the integer, as indicated by the following equation (26):

$$x = \begin{cases} 0.5 \\ 1.5 \\ 2.5 \\ 3.5 \\ 4.5 \\ \vdots \end{cases} \quad (26)$$

Thus, if only the real number a is a power of 2, it is possible to realize the representation with the power of 2 of the boundary values of the domain y and $f_Q(x)$, and to minimize an error by approximation of the functions f and g. This method is now explained below in more detail. It should be noted that the absolute value x is offset by 0.5 from the integer because the interval of the discrete values that can be assumed by the absolute value x is set to 1, and that, if the discrete values are spaced apart with an interval equal to 2 (0, 2, 4 . . . ), the offset is one-half the interval (1, 3, 5 . . . ) for comparable results.

For example, in case x is offset by 0.5 from the integer, and the real number "a"=2, with the constant C being e.g. C=1/√2, it is possible to use approximation, for example, of f(x)≈F (x)=$2^{0.5-x}$. This is proper for number representation in a circuit or on a computer because the converted $f_Q(x)$ may be expressed as in the equation (27) and may be entirely expressed by powers of 2.

$$f_Q(x) = \begin{cases} 2^0, & x = 0.5 \\ 2^{-1}, & x = 1.5 \\ 2^{-2}, & x = 2.5 \\ 2^{-3}, & x = 3.5 \\ 2^{-4}, & x = 4.5 \\ \vdots & \end{cases} \quad (27)$$

Figure 11:
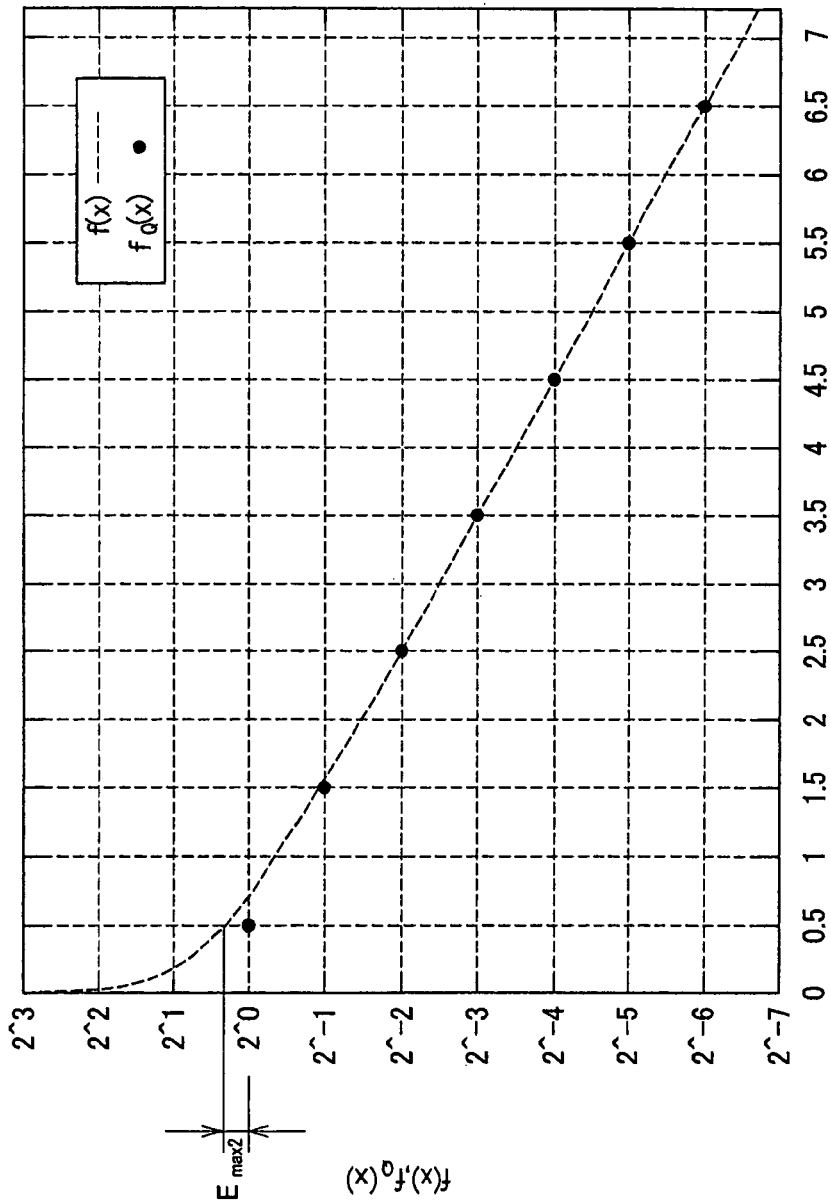
FIG. 11 is a graph showing the relation between $g_Q(y)$ and the corresponding y domain in case the abscissa is a log axis, a real number a=2 and a constant $C=1/\sqrt{2}$.

This may be represented by a graph shown in FIG. 11. That is, FIG. 11 shows the relation between the converted $f_Q(x)$ and x offset by 0.5 from the integer in case the real number a=2 and the constant C=1/√2.

The circuit for outputting this $f_Q(x)$ is now explained. The values of $f_Q(x)$ are all the powers of 2, as shown by the above equation (27), in a manner suited for representation in a binary number. It is desirable to limit the maximum value that can be assumed by x, depending on characteristics of the communication channel or circuit requirements, in order to provide for a finite number of the values that can be assumed by x. The following are typical of the circuits for implementing $f_Q(x)$ shown by the above equation (27).

Figure 12:
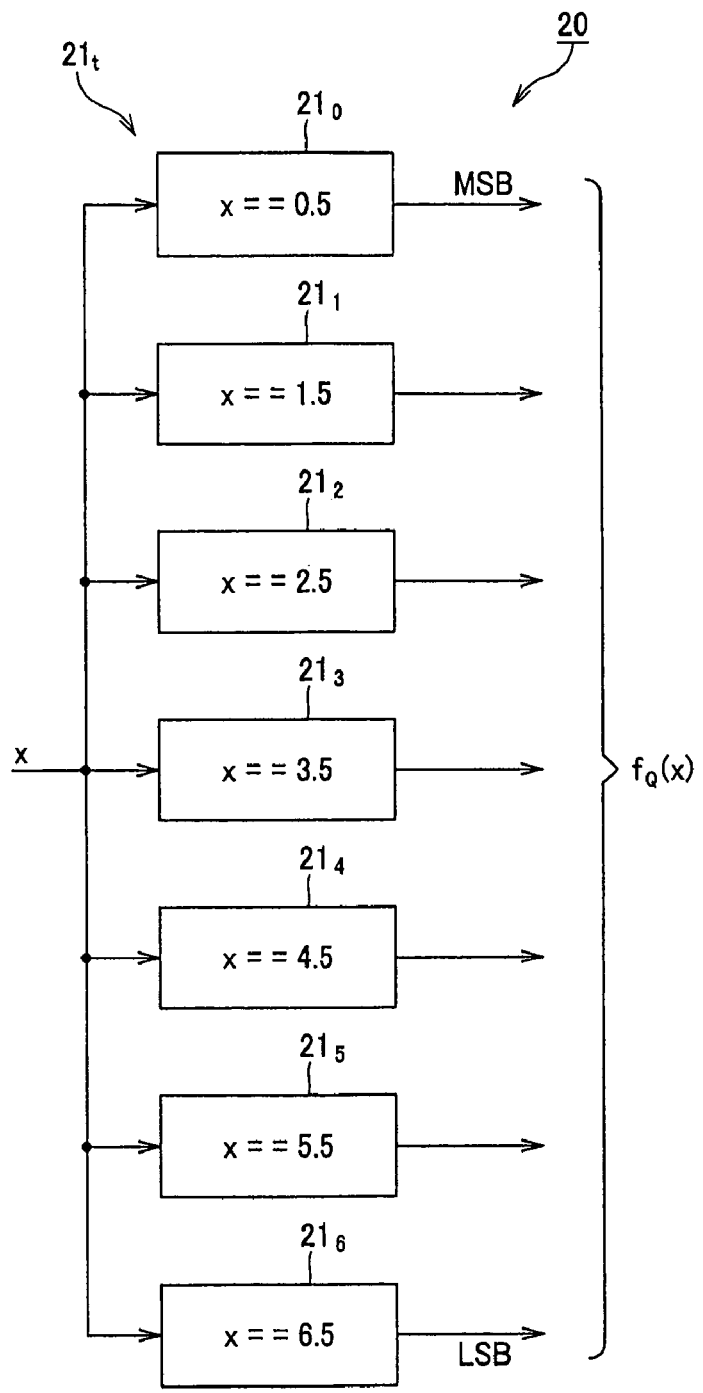
FIG. 12 is a circuit diagram showing an example of a conversion circuit for converting x into an output $f_Q(x)$ in case the output $f_Q(x)$ is to be expressed with a fixed binary point number for a real number a=2 and a constant $C=1/\sqrt{2}$ and incase the value that can be assumed by x is limited to 7 or less.

FIG. 12 is a circuit diagram showing an example of a converting circuit 20 for converting the input x into $f_Q(x)$ in case the output is represented by the fixed binary point numbers and in case the values that can be assumed by x is limited to 7 or less. The converting circuit 20 includes a decision block 21$_t$ having seven decision units 21$_0$ to 21$_6$ for determining whether the input x is any of 0.5, 1.5 . . . , 6.5. This decision block 21$_t$ makes up an output unit for outputting the value of the power of 2.

The input value to each of the decision units 21$_0$ to 21$_6$ is the absolute value $\beta_{m,n}$ of the message $Q_{m,n}$ and, if this absolute value $\beta_{m,n}(=|Q_{m,n}|)$ is, for example, 1.5, only the decision unit 21$_1$ outputs 1, with the remaining decision units 21$_0$, 21$_2$ to 21$_6$ outputting 0.

Figure 25:
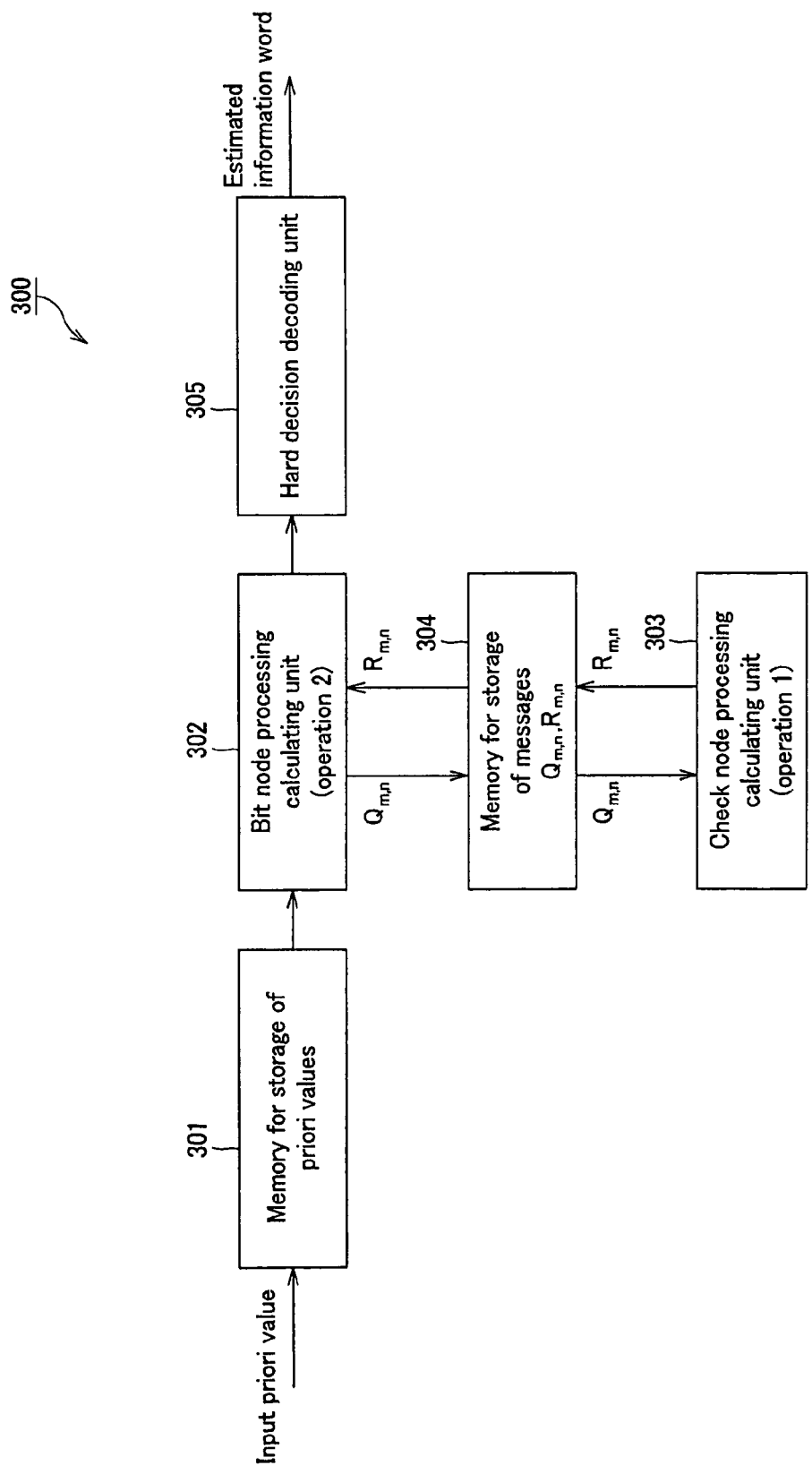
FIG. 25 is a block diagram showing a decoding device shown in a Non-Patent Publication 2 by T. Zhang et al.

In case $f_Q(x)$ is expressed by the fixed binary point number, the outputs of the decision units $21_0$ to $21_6$, making up the decision block $21_t$, for deciding on the input x, represent the entire bits, that is, the bits from the most significant bit (MSB) to the least significant bit (LSB) of $f_Q(x)$. That is, the bits output from the decision block $21_t$ themselves represent $f_Q(x)$, while the selection circuit shown in FIG. 25 is unneeded, thus appreciably simplifying the circuit configuration.

Figure 13:
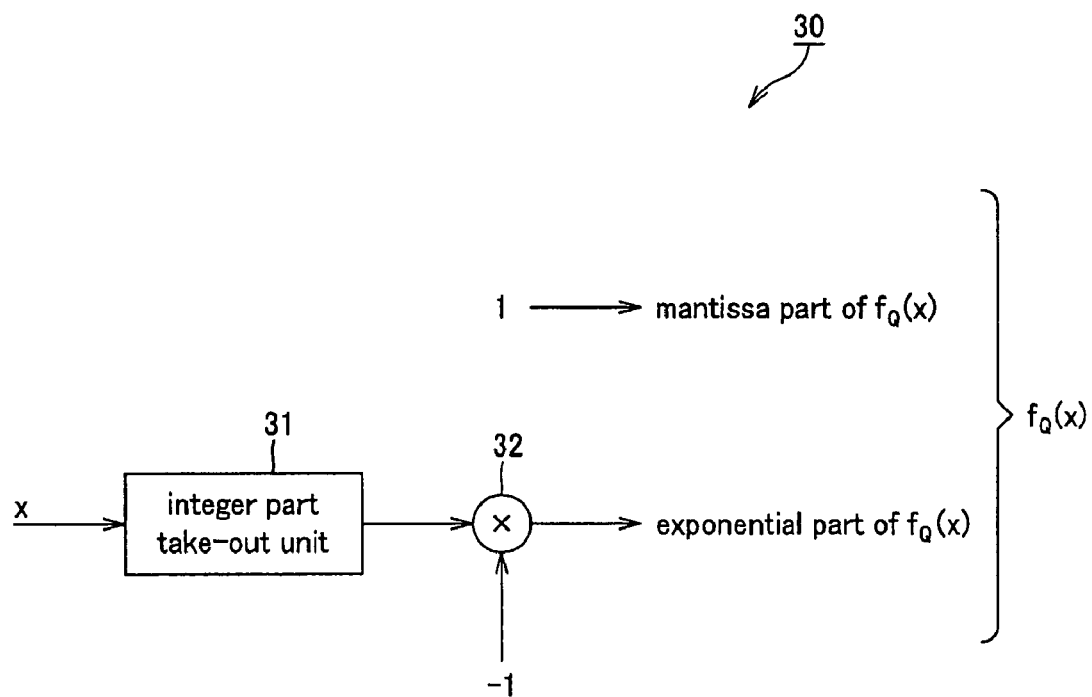
FIG. 13 is a circuit diagram showing an example of a conversion circuit for converting x into an output $f_Q(x)$ in case the output $f_Q(x)$ is to be expressed with a binary floating point number for a real number a=2 and a constant $C=1/\sqrt{2}$.

FIG. 13 shows a circuit configuration in which an output is represented by a binary floating point number. In FIG. 13, a converting circuit 30 in the case of a floating binary point number includes an integer part takeout unit 31 for taking out the integer part of x, a multiplication unit 32 for outputting the value of an exponential part of $f_Q(x)$ based on the integer part thus taken out, and an output unit, not shown, for outputting 1 as the value of a mantissa part of $f_Q(x)$. Thus, if the integer part of x is represented by [x], the converting circuit 30 issues an output at all times with the mantissa part set to 1. In the present description, [x] represents the maximum integer not exceeding x. On the other hand, if the real number a, as the base of the log, is such that $a=2^N$, N being a positive integer, the multiplication unit 32 is supplied with (-N) and [x] as an integer part of x, and the product $-N \times [x]$ is output as an exponential part. Since the real number $a=2$ in the present case, $N=1$, and $(-N)=-1$ are entered to the multiplication unit 32. In this manner, the mantissa part is able to output $f_Q(x)$ as $(-N) \times [x]$.

With the above circuits, the output values $f_Q(x)$ are all expressed with the power of 2. Thus, these circuits may be implemented more readily than the circuit of FIG. 27. The calculations may be simplified not only in the circuit but also on the software.

By expressing the message between the bit node and the check node by the log likelihood ratio of the real number a, having the power of 2 as a base, by offsetting the values, that may be assumed by the absolute values of the message received by the check node processing calculating unit 4, shown in FIG. 5, by 0.5, to approximate the function f(x) defined by the above equation (16) by $2Ca^{-x}$, and by properly selecting the constant C, the conversion by the approximate equation of f(x) may be in a form suitable for circuits or computers representing the number by the binary system.

As for g(Y), as inverse transform of f(x), $g_Q(y)$, outputting the inverse function of the approximate equation $F(x)=2Ca^{-x}$ of f(x) by a representative value of the integer, may be represented, with $C=1/\sqrt{2}$ and with the real number $a=2$, by the following equation (28):

$$g_Q(y) = \begin{cases} 0, & 2^0 \le y \\ 1, & 2^{-1} \le y < 2^0 \\ 2, & 2^{-2} \le y < 2^{-1} \\ 3, & 2^{-3} \le y < 2^{-2} \\ 4, & 2^{-4} \le y < 2^{-3} \\ \vdots \end{cases} \quad (28)$$

-continued $$g_Q(y) = \begin{cases} 0, & 2^0 \le y \\ 1, & 2^{-1} \le y < 2^0 \\ 2, & 2^{-2} \le y < 2^{-1} \\ 3, & 2^{-3} \le y < 2^{-2} \\ 4, & 2^{-4} \le y < 2^{-3} \\ \vdots \end{cases} \quad (28)$$

Figure 14:
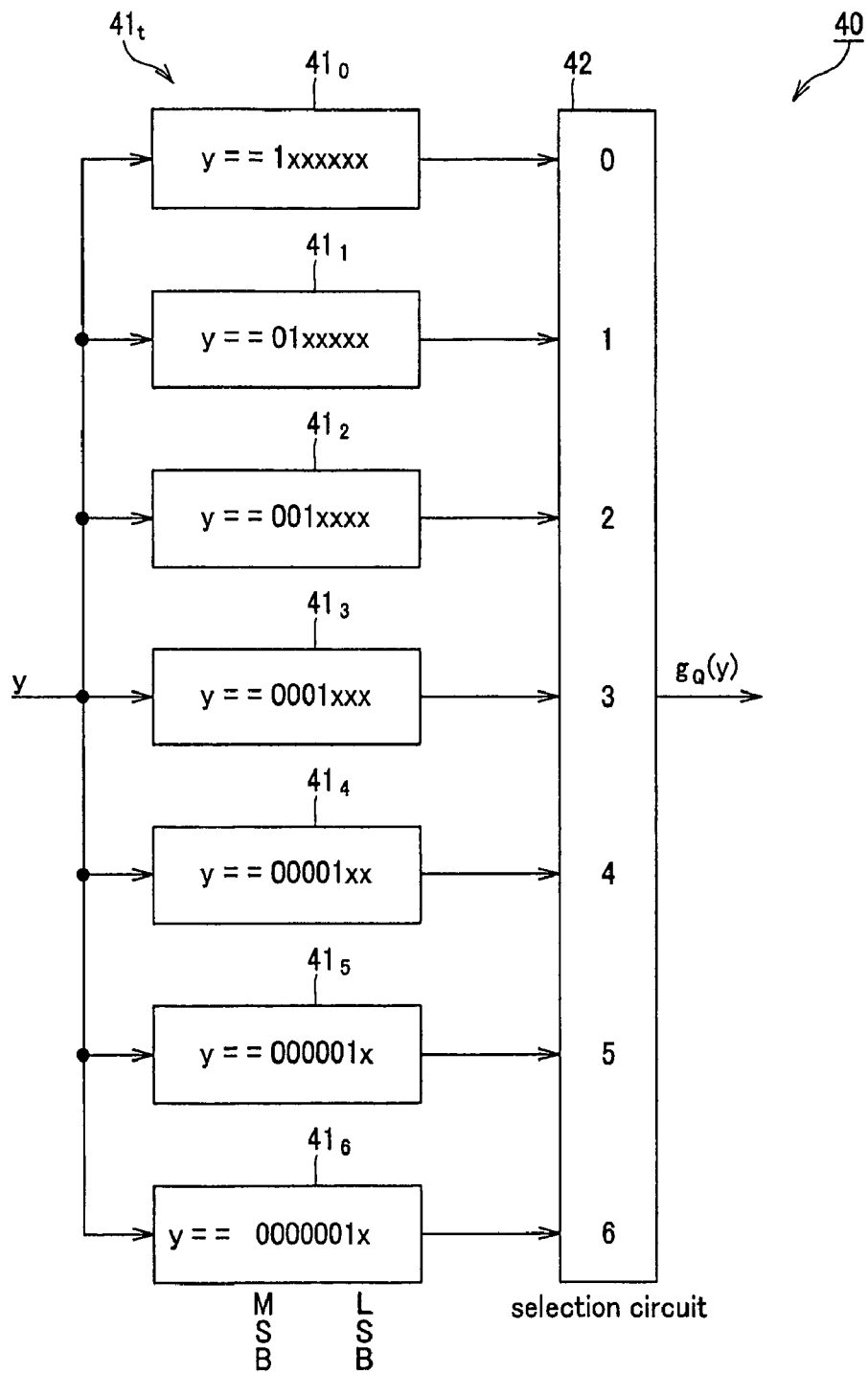
FIG. 14 is a circuit diagram showing an example of a conversion circuit for acquiring $g_Q(y)$ in case an input y is expressed with a fixed binary point number for a real number a=2 and a constant $C=1/\sqrt{2}$.

FIG. 14 depicts a circuit diagram of a converting circuit for obtaining $g_Q(y)$ in case the input y is a fixed binary point number. Specifically, FIG. 14 shows an example of a circuit for outputting $g_Q(y)$ in case the maximum value that can be assumed by $g_Q(y)$ is limited to 6. The converting circuit 40 includes a decision block $41_t$, made up by seven decision units $41_0$ to $41_6$ for comparing the bit patterns of the input y for verifying the coincidence, and a selection circuit 42 for selecting one of 0 to 6 from the outputs of the decision block $41_t$ to output the selected value as $g_Q(y)$. The y domain decision in the decision block $41_t$ may be made by counting up the number of contiguous zeros as from the most significant bit (MSB) of y. In the conditions of the decision block $41_t$ in the drawing, x denotes "don't care". For example, the decision unit $41_0$ outputs 1 when the MSB is 1, that is, when there is no zero. The decision units $41_1$ when the MSB is 0 and when the bit next following lower bit is 1, that is, when only one 0 is contiguous. The conditions of the decision units $41_0$ to $41_6$ are exclusive, and only one is true, so that the selection circuit 42 selects only one value for any values of y, and outputs the so selected value as $g_Q(y)$.

Figure 15:
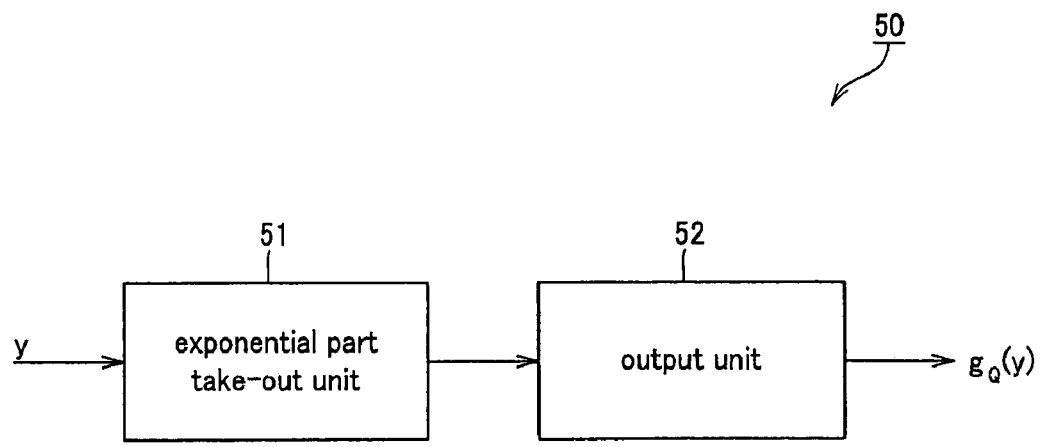
FIG. 15 is a circuit diagram showing an example of a conversion circuit for acquiring $g_Q(y)$ in case an input y is expressed with a binary floating point number for a real number a=2 and a constant $C=1/\sqrt{2}$.

FIG. 15 shows a circuit configuration in which the input y is represented by the binary floating point number. In FIG. 15, a converting circuit 50 includes an exponential part takeout unit 51 for taking out an exponential part A of the input y, and an output unit 52 for outputting $g_Q(y)$, as a representative integer value, based on an output result of the exponential part takeout unit 51. With the real number as the base of the log being such that $a=2^N$, N being a positive integer, the output unit 52 outputs, as $g_Q(y)$, the absolute value of the maximum integer not exceeding the value of A/N as found by the exponential part A taken out by the exponential part takeout unit 51. Since the present case is that for the real number $a=2$, $N=1$, with the output unit 52 simply outputting the absolute value of the output A of the exponential part takeout unit 51. Thus, when the input is represented by the binary floating point number, $g_Q(y)$ may be obtained by finding the absolute value of the exponential part of y.

Figure 27:
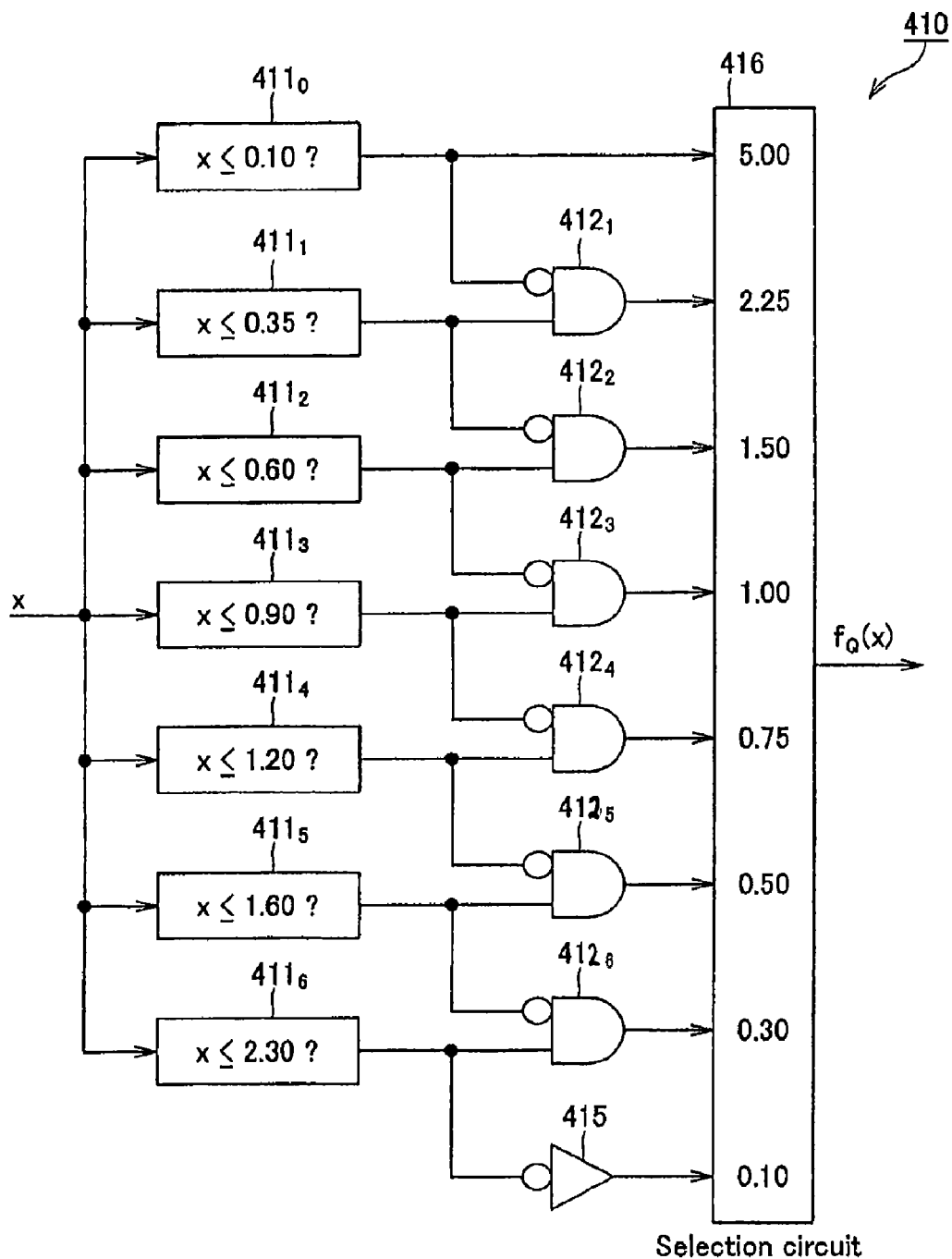
FIG. 27 is a block diagram showing a typical conventional circuit for outputting $f_Q(x)$ from x.

The above circuits may be implemented more readily than the conventional configuration, for example, as in the configuration of FIG. 27. The calculations may be appreciably simplified by implementation with software, in addition to that by a circuit.

For depicting both the boundary values of the domains of y outputting $f_Q(x)$ and the integer value $g_Q(y)$ by the power of 2, it is sufficient to suitably select the constant C. The above case with $C=1/\sqrt{2}$ and the real number $a=2$ is the case where the real number a is an odd number multiple of 2, such that it is sufficient to set the constant C as 0.5×odd number power of 2, as shown in the following equation (29):

$$\begin{cases} C = 2^{0.5 \times (2i+1)} \\ a = 2^{(2k+1)} \end{cases} \quad (29)$$

where i and k denote optional integers.

As noted in the foregoing, in the above case where the value of x is an integer, and the real number "a" is an odd number power of 2, the converted value $f_Q(x)$ of x quantized cannot be represented by the power of 2. However, as again noted in the foregoing, the value of $f_Q(x)$ and the boundary values of the domain of y outputting the integer value $g_Q(y)$ simultaneously may be expressed by the power of 2, even if the real number "a" is an odd number power of 2, but is the power of 2, by offsetting x from integer values by 0.5.

In order for the converted value of $f_Q(x)$, obtained by the approximate equation F(x) of the function f, and the boundary values prescribing each domain of the input y in case of conversion to $g_Q(y)$ by the inverse function G(y) of the approximate equation F(x), to be of a form suited for a computer or a circuit, it is sufficient that the base "a" of the log is not only the odd number power of 2 but also the power of 2, such that comparable results may be obtained by selecting the real number so as to be an even number power of 2, such that the real number a=4, 8, 16 . . . , as in the above case where the value of x is an integer. In such case, the constant C is a power of 2 (0.5×odd number power of 2), as indicated by the following equation (30)

$$\begin{cases} C = 2^{0.5 \times (2i)} \\ a = 2^{(2k)} \end{cases} \quad (30)$$

For example, the approximate equation of f(x) for the real number a=4 and the constant C=1 may be represented by $2^{1-2x}$. If, as in the above equation (26), x is offset from integer values by 0.5 such that x is {0.5, 1.5, 2.5, . . . }, then $f_Q(x)$ may all be represented by the power of 2, as indicated by the following equation (31):

$$f_Q(x) = \begin{cases} 2^0, & x = 0.5 \\ 2^{-2}, & x = 1.5 \\ 2^{-4}, & x = 2.5 \\ 2^{-6}, & x = 3.5 \\ 2^{-8}, & x = 4.5 \\ \vdots \end{cases} \quad (31)$$

In this case, the boundary values, indicating the domain of the input y for effecting conversion to the integer value $g_Q(y)$, all may be expressed by the powers of 2, as indicated by the following equation (32):

$$g_Q(y) = \begin{cases} 0, & 2^0 \le y \\ 1, & 2^{-2} \le y < 2^0 \\ 2, & 2^{-4} \le y < 2^{-2} \\ 3, & 2^{-6} \le y < 2^{-4} \\ 4, & 2^{-8} \le y < 2^{-6} \\ \vdots \end{cases} \quad (32)$$

Thus, even if x is offset from the integer by 0.5 and the real number "a", that is, the base of the log likelihood ratio of the message $Q_{m,n}$ and $R_{m,n}$ is an even number power of 2, $f_Q(x)$ may be expressed by the power of 2, while the boundary values of the domain of the values of y for outputting $g_Q(y)$ as integers may be represented by the power of 2. By this expressing method, the calculations may be as simple as when the base of the log a=2, thereby providing a simplified circuit configuration of the check node processing calculating unit.

Figure 16:
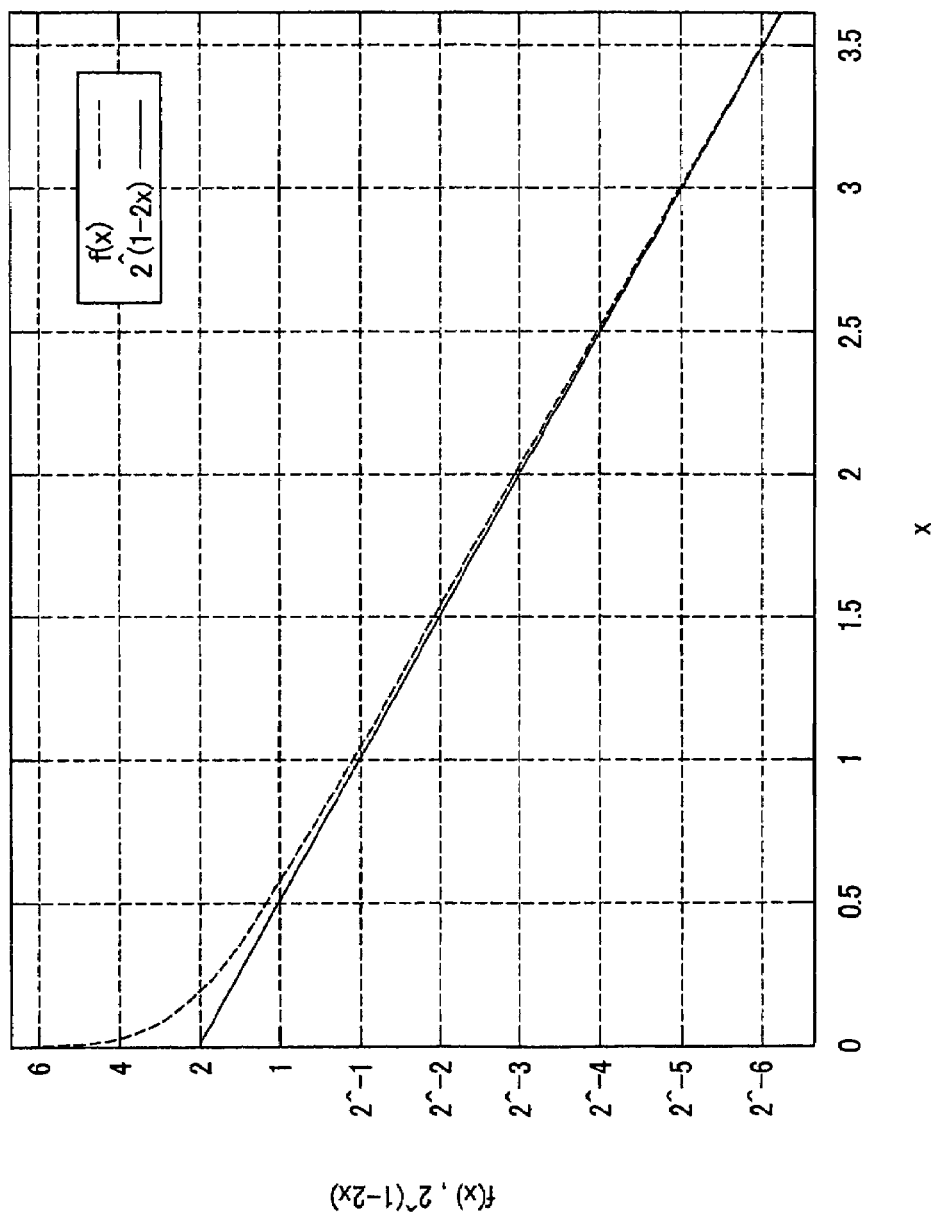
FIG. 16 is a graph showing f(x) and an approximate equation F(x) in case the abscissa is a log axis, with a real number a=4 and with a constant C=2.

FIG. 16 is a graph for showing the values of f(x) and the approximate equation in case the ordinate is the log axis, the base of the log likelihood ratio is 4 and the constant C is 1. It may be seen that, as x is increased, f(x) approaches to $2^{1-2x}$, thus achieving good approximation.

Figure 17:
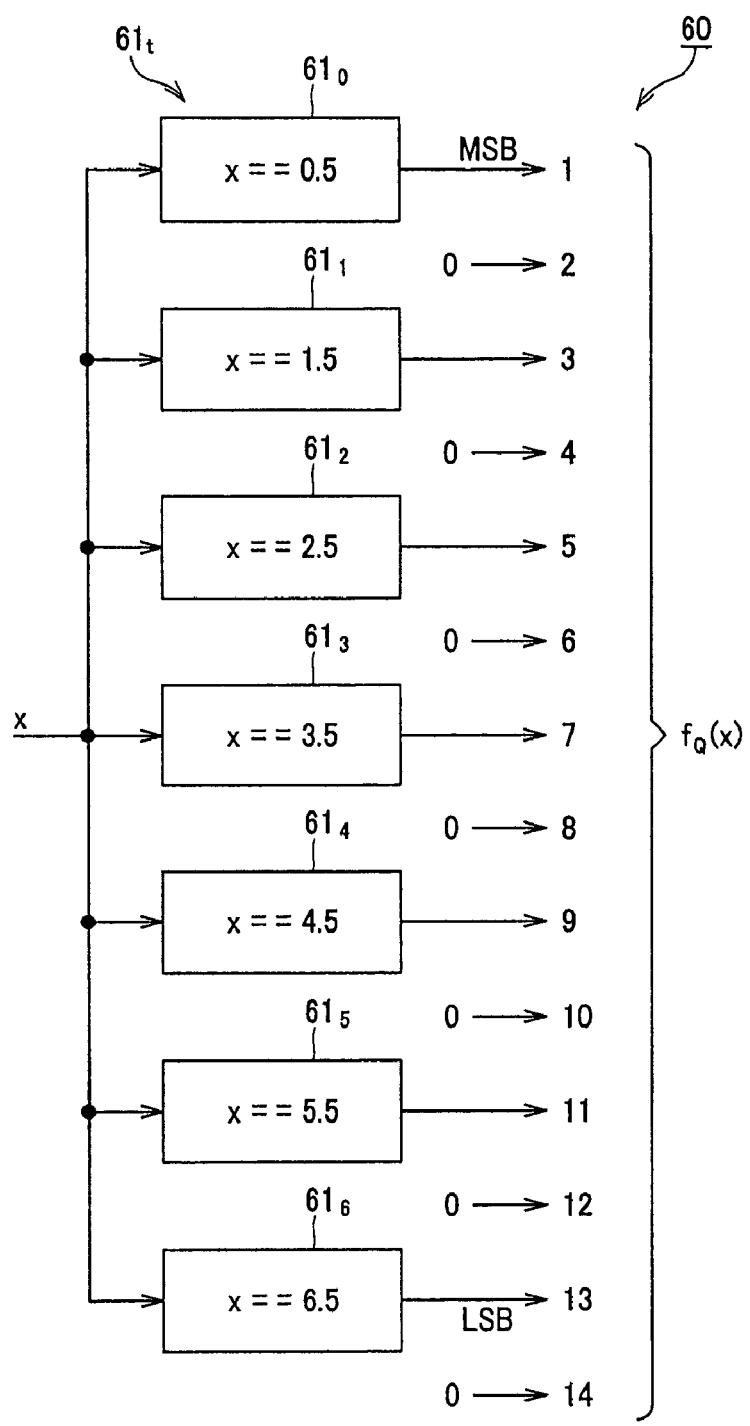
FIG. 17 is a circuit diagram showing an example of a conversion circuit for converting x into an output $f_Q(x)$ in case the output $f_Q(x)$ is to be expressed with a fixed binary point number for a real number a=2 and a constant C=2 and incase the value that can be assumed by x is limited to 7 or less.

FIG. 17 depicts a circuit diagram showing a converting circuit for converting x into $f_Q(x)$ in case the output is expressed by a fixed binary point number, the absolute values $\beta_{m,n}$ of the message $Q_{m,n}$ are expressed by the fixed binary point number and the values that can be assumed by x are limited to 7 or less. Referring to FIG. 17, the converting circuit 60 includes a decision block $61_t$, made up by decision units $61_0$ to $61_6$ for determining whether the input value x is 0.5, 1.5 . . . , 6.5. The decision block $61_t$, as an outputting unit for outputting $f_Q(x)$, differs slightly from the decision block $21_t$ shown in FIG. 12, and includes an outputting unit, not shown, for outputting bits of the value 0 between the output values from the decision units $61_0$ to $61_6$. The reason is that the values of $f_Q(x)$ become {$2^0$, $2^{-2}$, $2^{-4}$, . . . } and are expressed by even number powers of 2. The bits of $f_Q(x)$, that is, the bits from the MSB to the LSB, are expressed by the output values of the decision units $61_0$ to $61_6$ and the bits with the values of 0 in-between. The circuit is otherwise the same as that shown in FIG. 12.

In this case, the respective bits, output as the results of the decision of the values of x, indicate $f_Q(x)$, and are not in need of the selection circuit shown in FIG. 25, thus appreciably simplifying the circuit configuration.

Figure 18:
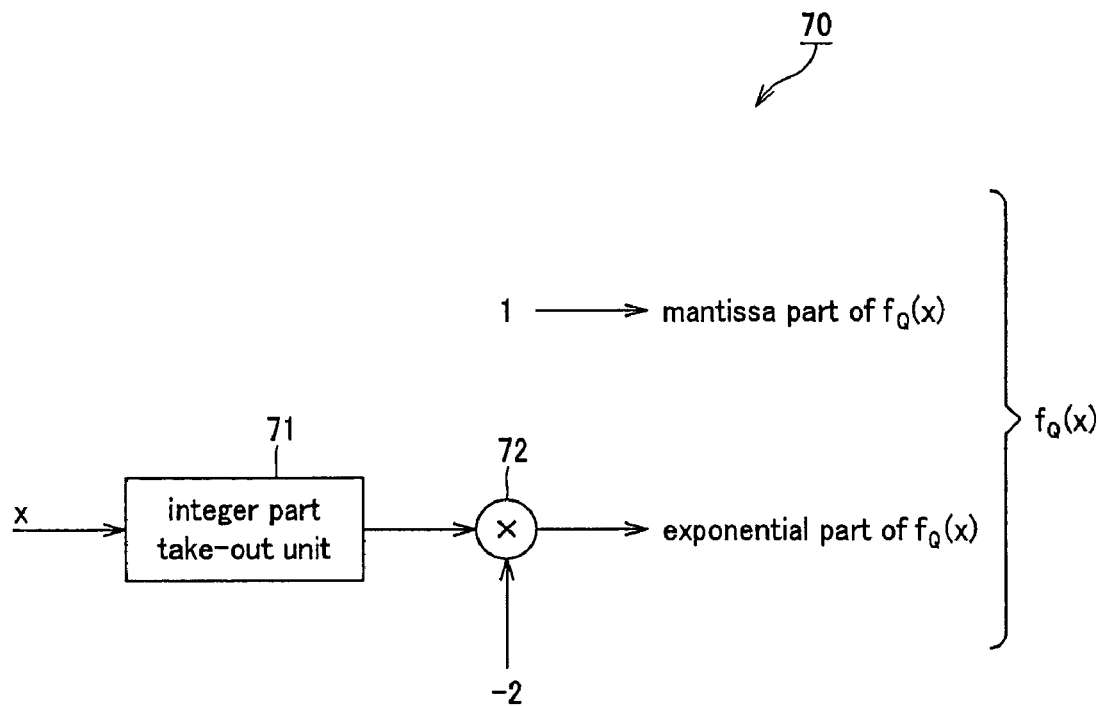
FIG. 18 is a circuit diagram showing an example of a conversion circuit for converting x into an output $f_Q(x)$ in case the output $f_Q(x)$ is to be expressed with a binary floating point number for a real number a=4 and a constant C=2.

FIG. 18 shows the configuration of a converting circuit 70 converting x into $f_Q(x)$ in case the output is expressed by a binary floating point number. Referring to FIG. 18, the converting circuit 70 for the case of the floating decimal point number includes an integer part take-out unit 71, for taking out an integer part of x, a multiplication unit 72, issuing an output as an exponential part of $f_Q(x)$ based on the so taken out integer part, and an output unit, not shown, for outputting 1 as a mantissa part of $f_Q(x)$. As in the circuit shown in FIG. 13, if the real number "a" as the base of the log is expressed as $a=2^N$, N being a positive integer, the multiplication unit 72 is supplied with (−N) and an integer part [x] of x to output the product (=(−N)×[x]) thereof as an exponential part. Since here a=4 and N=2, the multiplication unit 72 is supplied with (−N)=−2, which is multiplied with the integer part of x, so that an output is issued as an exponential part of $f_Q(x)$.

Figure 19:
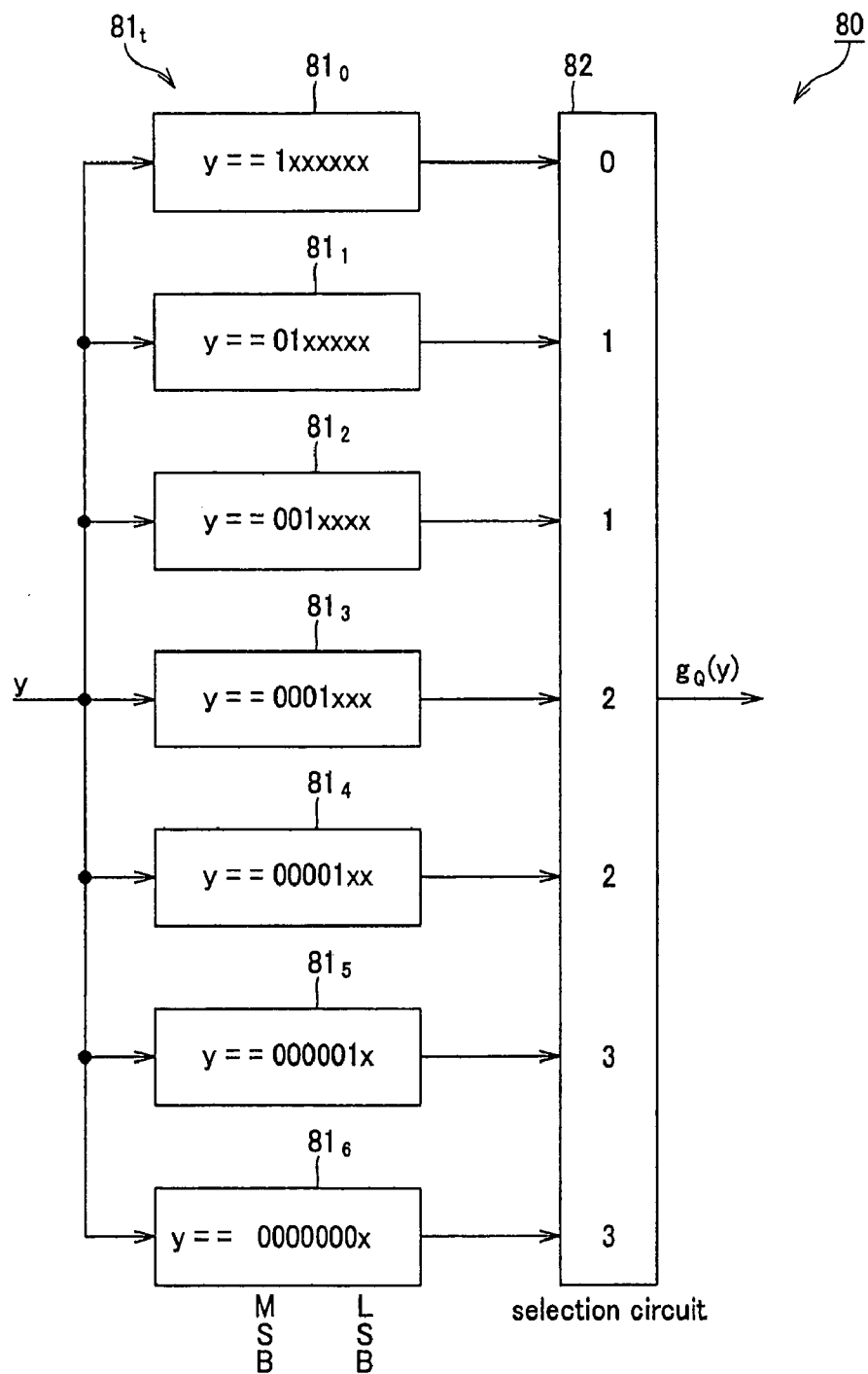
FIG. 19 is a circuit diagram showing an example of a conversion circuit for acquiring $g_Q(y)$ in case an input y is expressed with a binary fixed decimal point number for a real number a=2 and a constant C=2.

FIG. 19 depicts a circuit diagram showing a converting circuit 80 for obtaining $g_Q(y)$ in case x is offset by 0.5 from integer values and the real number "a" and the constant C are such that a=4 and C=1. Specifically, FIG. 19 shows an example of a circuit for outputting $g_Q(y)$ in case the input y is represented by the fixed binary point number and in case the maximum value that can be assumed by $g_Q(y)$ is limited to 3. The converting circuit 80 includes a decision block $81_t$, made up by seven decision units $81_0$ to $81_6$ for determining the domain to which belongs the input y from the bit pattern of the input y, and a selection circuit 82 for selecting one of values of 0 to 3 from the decision block $81_t$ to output the so selected value as $g_Q(y)$. As for the decision of the domain of y in the decision block $81_t$, since the boundary values, representing a domain, are expressed by the power of 2, the domain to which belongs the input y may be determined solely by counting the number of consecutive 0s from the most significant bit (MSB) of y, as in the circuit of FIG. 14, described above. Specifically, 0, 1, 2 and 3 are output when the number of consecutive 0s is 0, 1 or 2, 3 or 4 and 5 or 6, respectively.

Figure 20:
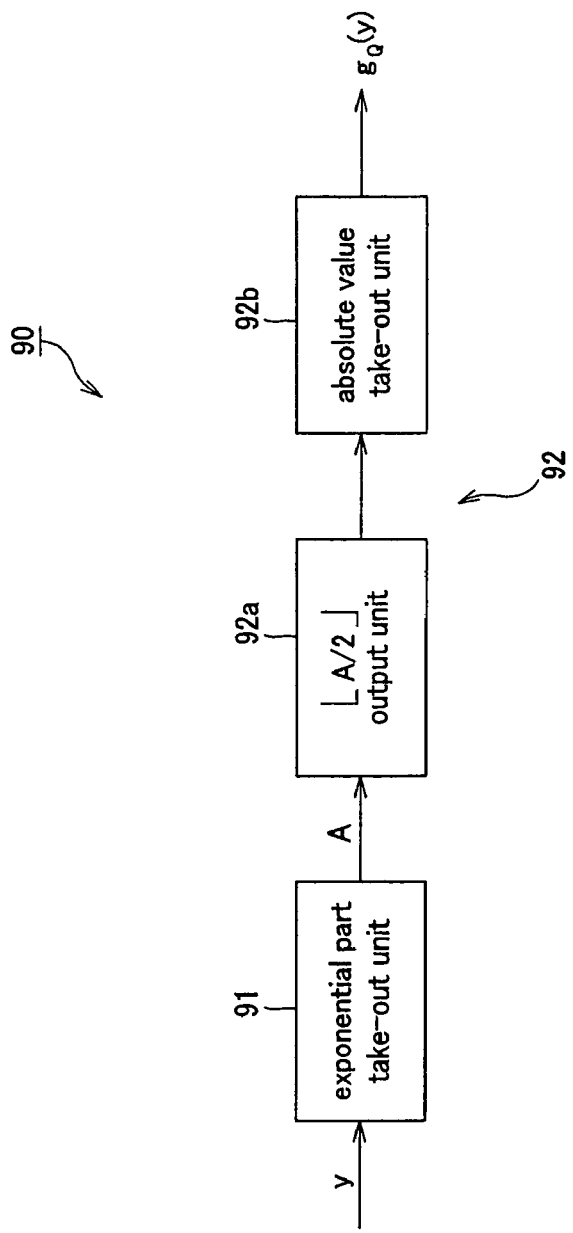
FIG. 20 is a circuit diagram showing an example of a conversion circuit for acquiring $g_Q(y)$ in case an input y is expressed with a binary floating point number for a real number a=2 and a constant C=2.

FIG. 20 shows a circuit configuration of outputting $g_Q(y)$ in case the input y is expressed by a binary floating point number. Even in case the real number "a" is an even number power of 2, a converting circuit 90 includes, as in the above case of FIG. 15 in which the real number "a" is an odd number power of 2, an exponential part take-out unit 91 for taking out an exponential part A of the input y and an output unit 92 for outputting an integer representative value $g_Q(y)$ based on an output result A of the exponential part take-out unit, as shown in FIG. 20. With the real number "a", as the base of the log, being such that $a=2^N$, as described above, the output unit 92 includes an integer outputting unit 92a for outputting the maximum number not exceeding the value of A/N as found by the exponential part A taken out from the exponential part take-out unit 91, and an absolute value outputting unit 92b, outputting the absolute value of the output of the integer outputting unit 92a as $g_Q(y)$. Since the real number a=4, in this case, N=2 and the integer outputting unit 92a outputs [A/2] (maximum integer number not exceeding A/2), while the absolute value outputting unit 92b outputs the absolute value of [A/2] as $g_Q(y)$. In this manner, $g_Q(y)$ may be obtained more readily in case the input is expressed by the floating binary point number.

The above circuits may be implemented more readily than the conventional configuration, for example, as with the circuit shown in FIG. 25. The calculations may be appreciably simplified not only by a circuit but also with software implementation.

That is, in any converting circuit, the operations of the calculating units or the circuit configuration may be simplified, with any converting circuit, by the configuration in which the value $f_Q(x)$, converted from the absolute value of the message $Q_{m,n}$, by the approximate equation F(x) of f(x), is the power of 2, as indicated by the equations (27), (31), and in which the boundary values of the domain of y, input to the converting circuit for effecting conversion to $g_Q(y)$, is the power of 2, as indicated by the equations (28), (32). Moreover, the boundary values of the domain of y, outputting $f_Q(x)$ and the integer value $g_Q(y)$, may be the power of 2, no matter whether the real number "a" is an odd number power of 2 or an even number power of 2, by offsetting the absolute values $\beta_{m,n}$ of the message $Q_{m,n}$ by 0.5 from the integer values. Thus, the range of alternatives of the real number "a" may be broadened by offsetting the absolute values $\beta_{m,n}$ by 0.5 from the integer values.

The real number "a", as the base of the log likelihood ratio, may be the power of 2. It is noted that increasing the real number a is equivalent to increasing the quantization step and, thus, deteriorates the calculation accuracy. However, the circuit configuration is thereby simpler to expedite the calculations. If, on the other hand, the real number is decreased to reduce the quantization step, the calculation accuracy is improved to achieve a highly satisfactory bit error rate. Hence, it is sufficient to select the value of the real number "a", equivalent to the quantization step, responsive to the bit error rate, required by the system, or the signal to noise power ratio of the signals received. In case the quantization step has been increased to some extent, the number of times of repetition may be increased to achieve a bit error rate equivalent to one in case where the real number "a" is of a small value.

Moreover, in case the message $Q_{m,n}$ from the bit node to the check node assumes a value offset by 0.5 from an integer value (a value offset from discrete values including 0 and spaced apart at a constant interval by ½ of the constant interval), it is possible to reduce an error in effecting conversion to $f_Q(x)$ using an approximate equation F(x) of f(x). The efficacy in this case is now explained.

In case the message $Q_{m,n}$ assumes a value offset by 0.5 from the integer value, an error between f(x) and $f_Q(x)$, indicated by the above equation (16), becomes maximum in case $|Q_{m,n}|=0.5$, and may be calculated as in the following expression (33):

$$f(x)-f_Q(x)=f(0.5)-2^{0.5-0.5}=0.2465 \qquad (33)$$

This maximum error $E_{max1}$ is shown in FIG. 11.

On the other hand, in case the absolute value of the message $Q_{m,n}$ is an absolute value, an error between f(x) shown by the above equation (15) and $f_Q(x)$ is maximum for $|Q_{m,n}|=0.5$. Since f(x) diverges to infinity, the maximum error $E_{max2}$ is infinity, as shown in FIG. 9.

By offsetting the absolute values of the message $Q_{m,n}$ from the integer values by 0.5, conversion errors from f(x) to $f_Q(x)$ may be suppressed to smaller values.

The message $Q_{m,n}$ may be calculated from the above equation (10). It is noted that, in case $P_n$, re-defined by the equation (15-1), assumes a value offset by 0.5 from an integer value, and $g_Q(y)$ assumes an integer value in the conversion of $g_Q(y)$, it is possible for the absolute values $\beta_{m,n}$ of the message $Q_{m,n}$ (input x) to assume values offset by 0.5 at all times from the integer values at the time of initialization and iterative calculations to simplify the calculating processing and the circuit configuration in the check node processing calculating unit to reduce the error in the approximate equation introduced as well as to allow outputting accurate values.

If the above-described sequence of operations is followed, $Q_{m,n}$ is initialized in the step 0 to a value $P_n$ offset by 0.5 from an integer value. In the step 1, absolute values $\beta_{m,n}$ of the message are converted into $f_Q(x)$, and the integer value $g_Q(y)$ is obtained from the sum value y. The code separately found is multiplied with $g_Q(y)$ to obtain an integer value $R_{m,n}$, which is used as a message from the check node to the bit node. In the step 2, $Q_n$ as found in the above equation (9) is found to update $Q_{m,n}$ by the above equation (10). Since $P_n$ is a value offset 0.5 from the integer value, and $R_{m,n}$ is an integer value, it is seen from the above equations (9) and (10) that $Q_n$ and $Q_{m,n}$ are offset at all times by 0.5 from the integer values.

The priori probability $P_n$ is offset by 0.5 because $P_n$ is a discrete value with an interval of 1. In case $P_n$ is to be a discrete value with an interval of 2, it is sufficient that $P_n$ is offset by a value equal to one-half the interval, that is, that $P_n$ be −3, −1, 1, 3, . . . .

Meanwhile, an error of approximating f(x) to $2Ca^{-x}$ becomes larger for a smaller range of the value of x. In case of approximation, f(x) is converted to a value smaller than the real value of f(x), for an area where x is smaller, for example, than unity, as shown in the graph of FIG. 8. It is noted that the abscissa x assuming a value in the vicinity of 0 is equivalent to a smaller value of the SN (signal to noise) ratio (SNR) of the received word, indicating that the received word is affected appreciably by a large noise. In case the information processing apparatus of the present invention is used as a decoding apparatus for decoding signals of digital broadcast, as an example, and the S/N ratio of the input is sufficiently high, for example in case the received word with a bit error rate on the order of $10^{-5}$ is decoded, the absolute value x of the message rarely assumes a value in the vicinity of 0, wherein the effect of the error caused by approximation is practically nil.

If, in the case of a mobile device, such as a mobile phone, the receiving state is poor such that signals with a large bit error rate is received, the error for a range of smaller values of x may be reduced by offsetting the absolute values $\beta_{m,n}$ of the message $Q_{m,n}$ by 0.5 from the integer values, thereby achieving an optimum bit error rate.

It is to be noted that the present invention is not limited to the above-described embodiments, and may be changed broadly without departing from the purport of the present invention. For example, the present invention may be applied to a storage (memory device), an information recording and/or reproducing apparatus or transmission/receiving apparatus.

Figure 21:
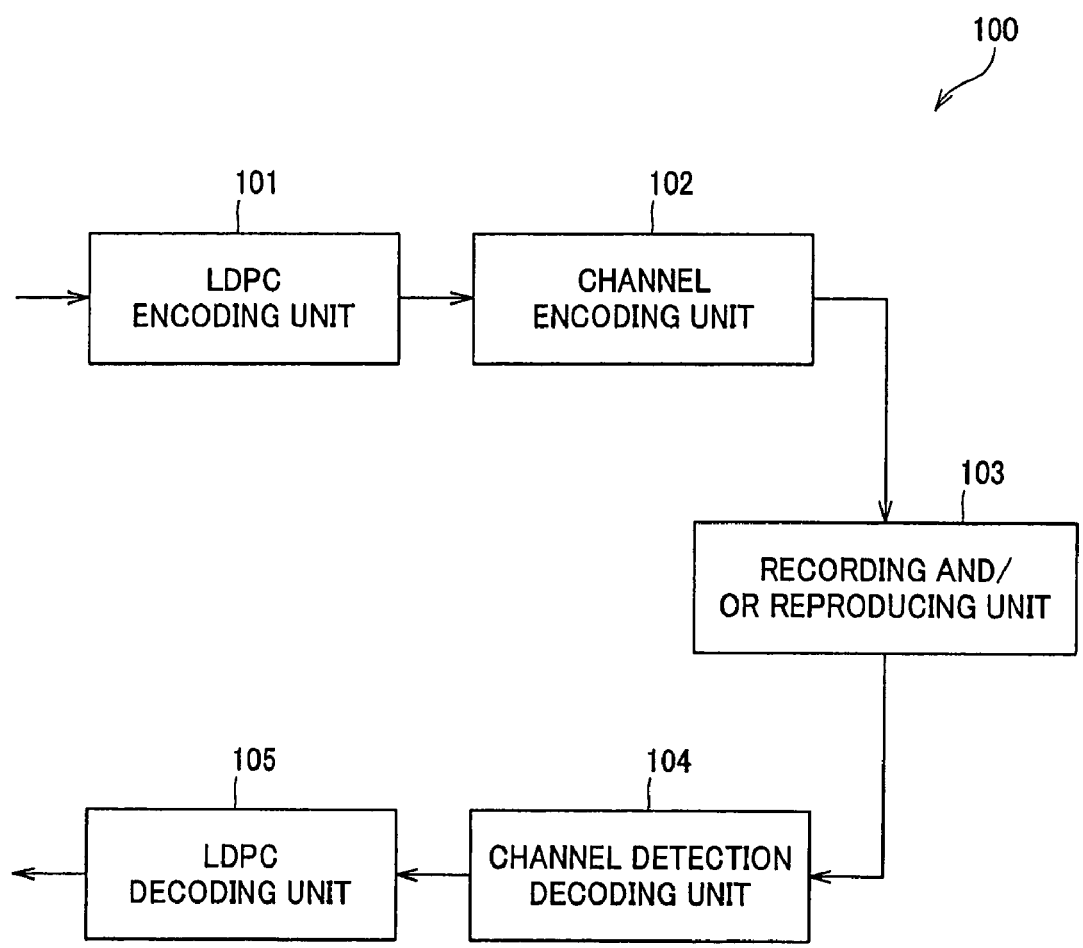
FIG. 21 is a block diagram showing an information processing apparatus having a code detection device embodying the present invention.
Figure 22:
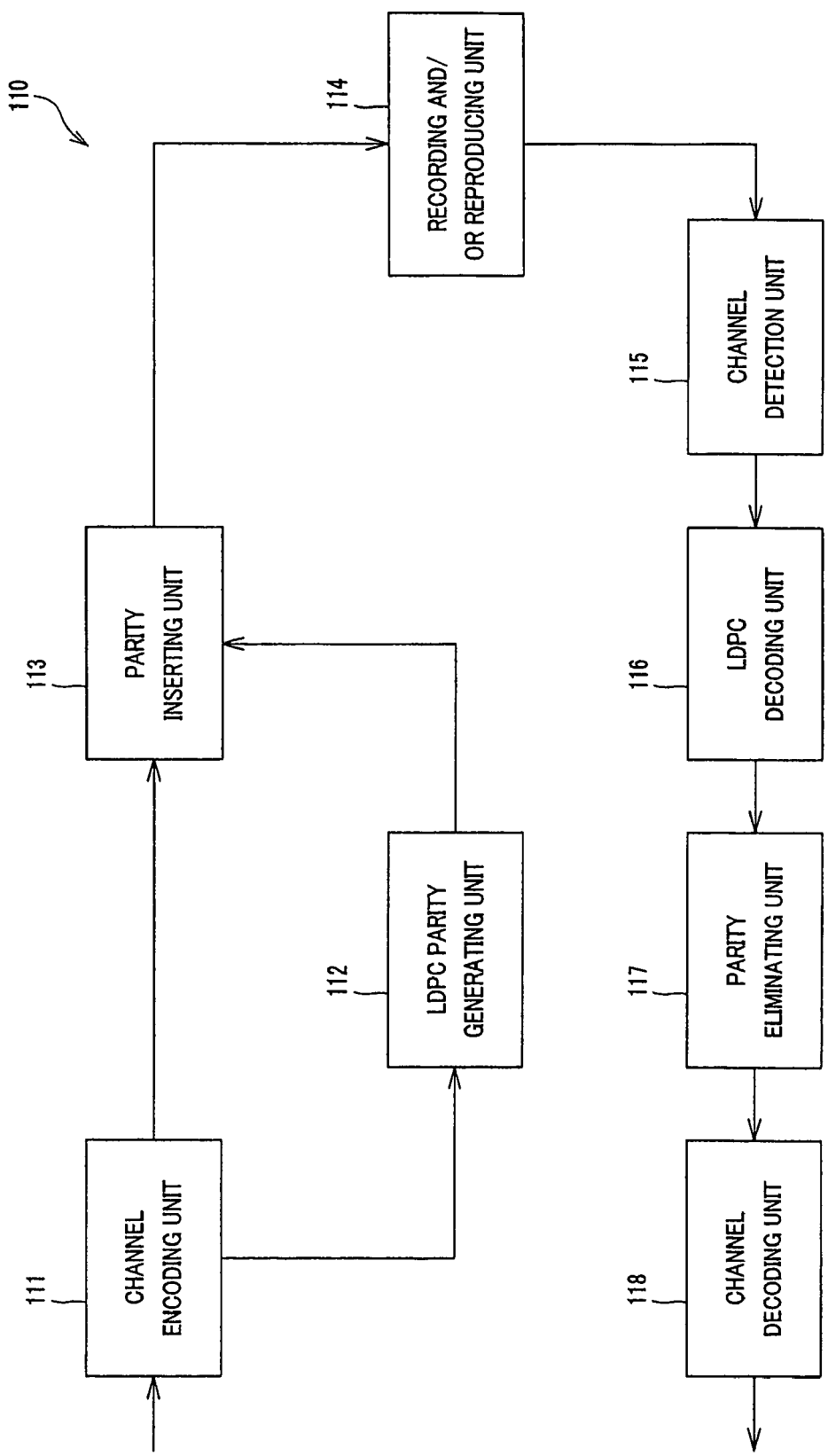
FIG. 22 is a block diagram showing an information processing apparatus having a code detection device embodying the present invention.
Figure 23:
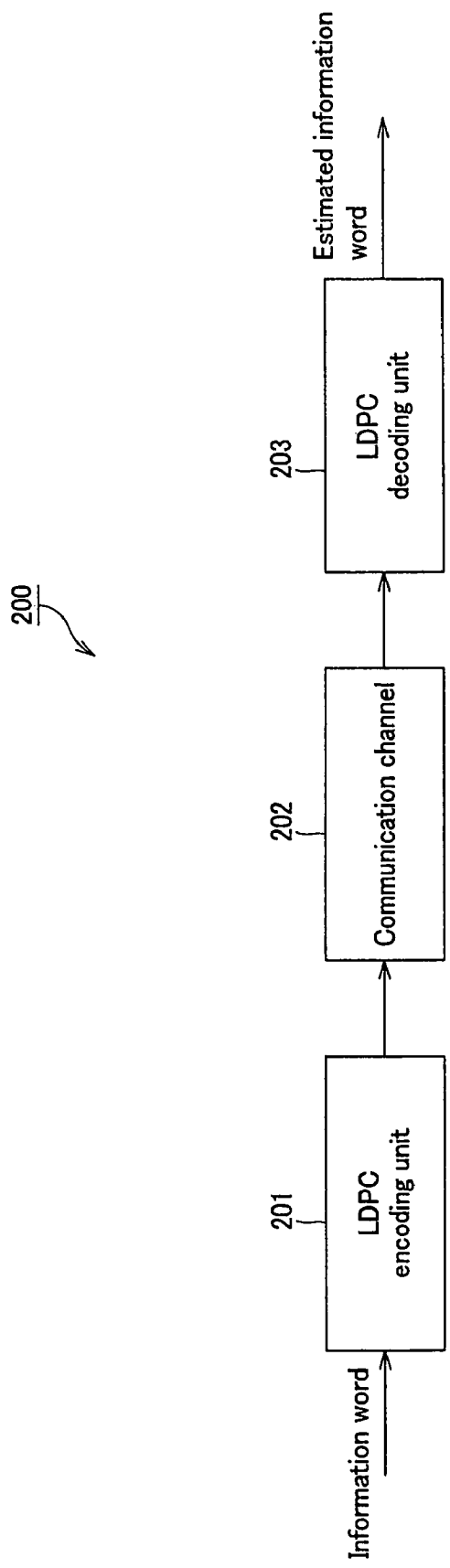
FIG. 23 is a block diagram showing an example of a communication system employing an LDPC code.
Figure 24:
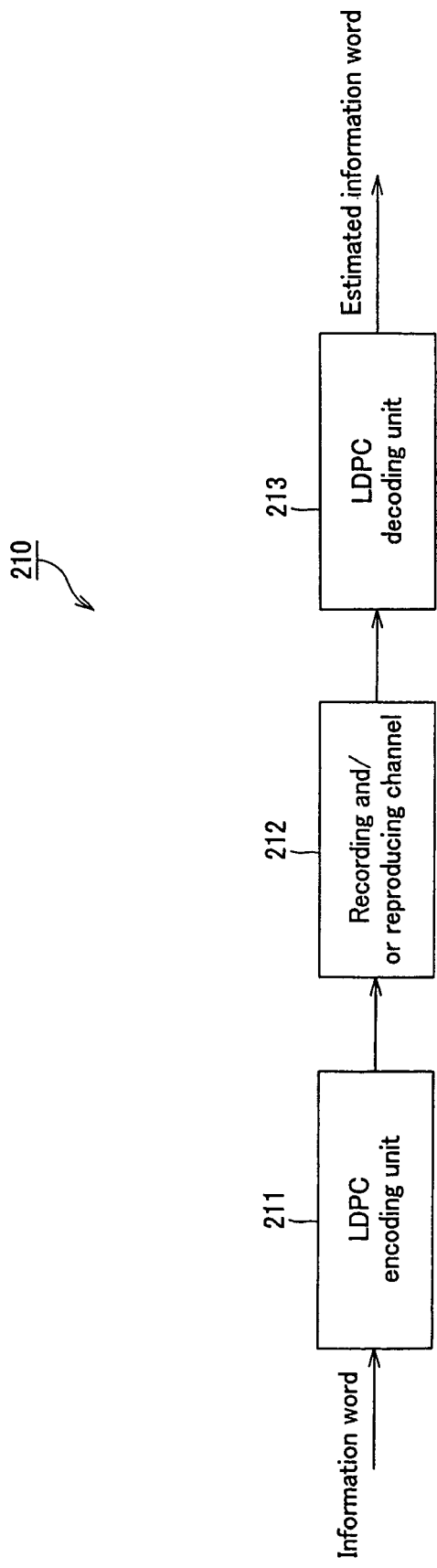
FIG. 24 is a block diagram showing a recording and/or reproducing system employing an LDPC code.

FIGS. 21 and 22 depict block diagrams showing a recording and/or reproducing apparatus including a code decoding apparatus (decoding apparatus) of the instant embodiment. In FIG. 21, a recording and/or reproducing apparatus 100 includes an LDPC encoding unit 101 for multiplying a message, such as music or images, with a generating matrix for generating an LDPC code, to generate the LDPC code, an encoding unit 102 for channel-encoding the so generated LDPC code, a recording and/or reproducing unit 103 for recording the codes and for reading out so recorded codes, a channel decoding unit 104 for detecting and decoding codes from the read-out data in dependence upon channel characteristics and channel codes, and an LPDC decoding unit 105 for decoding the codes from the channel-decoded data. The data decoded by the LPDC decoding unit 105 is decoded into a message.

Another recording and/or reproducing apparatus 110, shown in FIG. 22, includes an encoding unit 111 for channel encoding a message, such as music or images, a parity generator 112 for generating a LDPC parity for channel-encoded codewords, and a parity inserting unit 113 for generating a codeword composed of an output of the encoding unit 111 into which is inserted the LDPC parity generated by the parity generator 112. The recording and/or reproducing apparatus 110 also includes a recording and/or reproducing unit 114 for recording the codeword, having the parity inserted therein, and for reading out the recorded codeword, a channel detection unit 115 for effecting the detection from the read-out codeword, in dependence upon channel characteristics, and an LDPC decoding unit 116 for detecting the codes of the channel-detected data. The recording and/or reproducing apparatus 110 further includes a parity eliminating unit 117 for eliminating the parity from the code-detected data from the LDPC decoding unit 116, and a channel decoding unit 118 for channel-decoding data freed of the parity data.

Thus, with the information processing apparatus, embodying the present invention, the decoding apparatus may be applied to a receiving device, from which the effect of the noise of data transmitted/received over a communication channel is to be removed, or to a variety of reproducing apparatus in which writing errors during recording and/or reproduction or errors caused by signal corruption during readout need to be corrected. By the application of the present decoding apparatus, the circuit configuration of a variety of information processing apparatus may be simplified to reduce the size of the information processing apparatus to assure higher productivity.

Although the present invention has been described with reference to specific embodiments, those of skill in the art will recognize that changes may be made thereto without departing from the spirit and scope of the present invention as set forth in the hereafter appended claims.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A decoding apparatus for decoding a low density parity check coded message using a message passing algorithm configured for propagating messages between a plurality of check nodes and a plurality of variable nodes, the check and variable nodes corresponding to the low density parity check code, comprising:

parts for setting a first message as a log likelihood ratio having, as a base, a real number "a" which is a power of 2;

a check node processing calculating unit for receiving the first message and a variable node processed message delivered from a variable node to a check node to calculate a check node processed message delivered from the check node to the variable node;

a variable node processing calculating unit for receiving the check node processed message calculated by the check node processing calculating unit to calculate the variable node processed message;

wherein the check node processing calculating unit includes a first converting circuit for converting an absolute value x of the first message into a value of the power of 2 to output the value, and a second converting circuit for subdividing an input y into a plurality of domains having boundary values prescribed with powers of 2, wherein the boundary values of the plurality of domains are correctly expressed by a finite number of bits when in binary form, the input value y being a sum of values converted by the first converting circuit from absolute values x of the first message from a totality of the variable nodes less one variable node, the second converting circuit converting all the numbers in the domain into integers;

a termination processing unit for stopping message passing between the variable node processing calculating unit and the check node processing calculating unit if at least one of the conditions of 1) a prescribed number of iterations are reached; and 2) a result of hard decision calculating meets a parity check equaling 0, is met; and a decoder for calculating a low density parity check decoded message from the variable node processed message using hard decision decoding.

2. A decoding apparatus as claimed in claim 1, wherein the check node processing calculating unit includes the first converting circuit for converting the absolute value x of the first message by a function $F(x)=2Ca^{-x}$ where C is an optional constant.

3. A decoding apparatus as claimed in claim 2, wherein:
if probabilities of the message delivered from a variable node n to a check node m being 0 and 1 are $q^0_{m,n}$ and $q^1_{m,n}$, respectively, and probabilities of the message delivered from the check node m to the variable node n being 0 and 1 are $r^0_{m,n}$ and $r^1_{m,n}$, respectively;
the first message $Q_{m,n}$ and the second message $R_{m,n}$ represent the probabilities $q^0_{m,n}$, $q^1_{m,n}$, $r^0_{m,n}$ and $r^1_{m,n}$ by the log likelihood ratio having the real number "a" as the base; and
the check node processing calculating unit includes the first converting circuit for transforming an absolute value x $(=|\log_a(q^0_{m,n}/q^1_{m,n})|)$ into an approximate value of f(x) $(=-C\ln|q^0_{m,n}-q^1_{m,n}|)$ using the function F(x).

4. A decoding apparatus as claimed in claim 3, wherein the check node processing calculating unit includes the second converting circuit for converting the numbers in the domain into integers by an inverse function G(y) of the function F(x), and wherein the inverse function G(y) converting the numbers in the domain from y $(=-C\ln|r^0_{m,n}-r^1_{m,n}|)$ into g(y) $(=|\log_a(r^0_{m,n}/r^1_{m,n})|)$.

5. A decoding apparatus as claimed in claim 2, wherein the check node processing calculating unit includes the second converting circuit for converting the numbers in the domain into integers by an inverse function G(y) of the function F(x).

6. A decoding apparatus as claimed in claim 1, wherein an adjustment is made to the absolute value x of the first message by offsetting x by 0.5 from discrete values including zero and spaced apart from one another by a constant interval, wherein the check node processing calculating unit includes the first converting circuit for converting the offset value of x into the value of the power of 2.

7. A decoding apparatus as claimed in claim 1, wherein an adjustment is made to a prior probability of the message as an input by offsetting it by 0.5 from discrete values including zero and spaced apart from one another by a constant interval, wherein the variable node calculates the variable node processed message based on the offset prior probability.

8. A decoding apparatus as claimed in claim 1, wherein the first converting circuit includes an outputting unit for outputting the value of the power of 2 based on the absolute value of the first message.

9. A decoding apparatus as claimed in claim 1, wherein the first converting circuit includes an outputting unit for outputting a mantissa part of the value of the power of 2 as 1 and for outputting an exponential part of the value of the power of 2 as an integer part of the absolute value x of the first message $\times N \times (-1)$, with a real number $a=2^N$, N being a positive integer.

10. A decoding apparatus as claimed in claim 1, wherein the second converting circuit includes a decision unit for determining the domain to which belongs the input y and an output unit for outputting an integer based on a result of the decision.

11. A decoding apparatus as claimed in claim 1, wherein the second converting circuit includes an exponential part takeout unit for taking out an exponential part of the input y and an output unit for outputting an absolute value of the maximum integer not exceeding a value corresponding to division by N of the exponential part as taken out, with a real number $a=2^N$, N being a positive integer.

12. A decoding apparatus for decoding a low density parity check coded message using a message passing algorithm configured for propagating messages between a plurality of check nodes and a plurality of variable nodes, the check and variable nodes corresponding to the low density parity check code, comprising:
parts for setting a first message as a log likelihood ratio having, as a base, a real number "a" which is a power of 2;
a check node processing calculating unit for receiving the first message and a variable node processed message delivered from a variable node to a check node to calculate a check node processed message delivered from the check node to the variable node;
a variable node processing calculating unit for receiving the check node processed message calculated by the check node processing calculating unit to calculate the variable node processed message;
wherein the check node processing calculating unit includes a first converting circuit for converting an absolute value x of the first message into a value of the power of 2 to output the value, and a second converting circuit for subdividing an input y into a plurality of domains having boundary values prescribed with powers of 2, wherein the boundary values of the plurality of domains are correctly expressed by a finite number of bits when in binary form, the input value y being a sum of values converted by the first converting circuit from absolute values x of the first message from a totality of the variable nodes less one variable node, the second converting circuit converting all the numbers in the domain into integers;
a termination processing unit for stopping message passing between the variable node processing calculating unit and the check node processing calculating unit if at least one of the conditions of 1) a prescribed number of iterations are reached; and 2) a result of hard decision calculating meets a parity check equaling 0, is met; and
a decoder for calculating a low density parity check decoded message from the variable node processed message using hard decision decoding.

13. An information processing apparatus for reproducing data encoded into a low density parity check code, which code is recorded, comprising:
a reproducing part for reading out data encoded into and recorded as the low density parity check code, and for decoding and reproducing the data using a message passing algorithm configured for propagating a first message, a check node processed message and a variable node processed message between a plurality of check nodes and a plurality of variable nodes, the check and variable nodes corresponding to the low density parity check code, wherein the reproducing part sets the first message as a log likelihood ratio having a real number "a", which is a power of 2, as a base;
a check node processing calculating unit in the reproducing part, unit for receiving the first message and the variable node processed message delivered from a variable node to a check node to calculate a check node processed message delivered from the check node to the variable node;
a variable node processing calculating unit, in the reproducing part, for receiving the check node processed message calculated by the check node processing calculating unit to calculate the variable node processed message;
wherein the check node processing calculating unit includes a first converting circuit for converting an absolute value x of the first message into a value of the power of 2 to output the value, and a second converting circuit for subdividing an input y into a plurality of domains having boundary values prescribed with powers of 2, wherein the boundary values of the plurality of domains are correctly expressed by a finite number of bits when in binary form, the input value y being a sum of values converted by the first converting circuit from absolute values x of the first message from a totality of the variable nodes less one variable node, the second converting circuit converting all the numbers in the domain into integers;

a termination processing unit for stopping message passing between the variable node processing calculating unit and the check node processing calculating unit if at least one of the conditions of 1) a prescribed number of iterations are reached; and 2) a result of hard decision calculating meets a parity check equaling 0, is met; and a decoder for calculating a low density parity check decoded message from the variable node processed message using hard decision decoding.

14. An information processing apparatus as claimed in claim 13, further comprising an encoding part for encoding into the low density parity check code; and a recording part for recording data encoded into the low density parity check code.

* * * * *